(12) United States Patent
Sumitani et al.

(10) Patent No.: US 6,671,208 B2
(45) Date of Patent: Dec. 30, 2003

(54) NONVOLATILE SEMICONDUCTOR STORAGE DEVICE WITH LIMITED CONSUMPTION CURRENT DURING ERASURE AND ERASE METHOD THEREFOR

(75) Inventors: Ken Sumitani, Tenri (JP); Takayuki Satoh, Tochio (JP)

(73) Assignee: Sharp Kabushiki Kaisha, Osaka (JP)

( * ) Notice: Subject to any disclaimer, the term of this patent is extended or adjusted under 35 U.S.C. 154(b) by 117 days.

(21) Appl. No.: 10/083,693

(22) Filed: Feb. 27, 2002

(65) Prior Publication Data

US 2003/0022411 A1 Jan. 30, 2003

(30) Foreign Application Priority Data

Jul. 27, 2001 (JP) .......................................... 2001-227824

(51) Int. Cl.[7] .............................................. G11C 16/16
(52) U.S. Cl. ............................ 365/185.23; 365/185.22; 365/185.29; 365/185.3; 365/185.12; 365/185.11
(58) Field of Search ..................... 365/185.29, 185.3, 365/185.33, 185.12, 185.11, 185.22, 185.23

(56) References Cited

U.S. PATENT DOCUMENTS 3,453,379 A * 7/1969 Holmes, Jr. ............... 178/4.1 R
3,646,573 A * 2/1972 Holmes, Jr. ............... 178/4.1 R

* cited by examiner

Primary Examiner—Andrew Q. Tran
(74) Attorney, Agent, or Firm—Morrison & Foerster LLP

(57) ABSTRACT

A nonvolatile semiconductor storage device includes a row decoder which independently controls a plurality of row select line groups. A negative voltage generated by a debooster circuit is applied to individual row select line groups with time shifts. As a result, peaks of erase current can be suppressed, so that consumption current can be reduced. In this device, a current limiting circuit of the booster circuit limits the consumption current of the booster circuit, allowing voltages to be generated within a range under a specified current value according to the conditions of voltage application to the individual row select line groups. Thus, a further reduction of the consumption current at a shorter scale can be achieved.

28 Claims, 20 Drawing Sheets

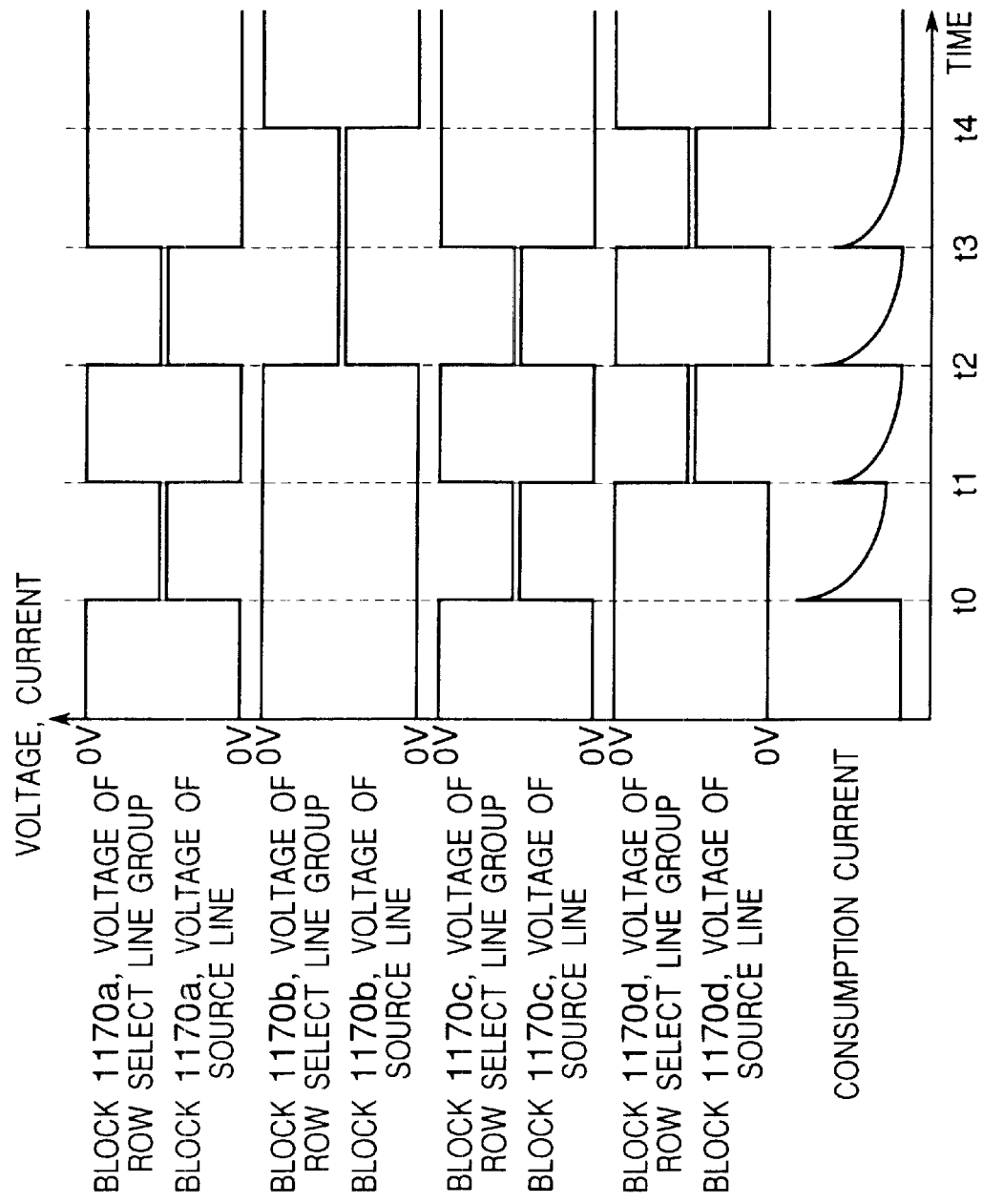

NONVOLATILE SEMICONDUCTOR STORAGE DEVICE WITH LIMITED CONSUMPTION CURRENT DURING ERASURE AND ERASE METHOD THEREFOR

BACKGROUND OF THE INVENTION

The present invention relates to a nonvolatile semiconductor storage device that has a means for executing erase in blocks and a storage contents erase method therefor.

There has recently been a growing demand for a nonvolatile semiconductor storage device capable of executing erase in blocks, intended mainly for portable equipment.

The block erase of a conventional nonvolatile semiconductor storage device capable of executing erase in blocks will be described below with reference to FIGS. 9A, 9B, 10A, 10B, 11, 12 and 13.

FIG. 9A shows a typical memory cell structure of an EEPROM (electrically erasable programmable ROM), which is a nonvolatile semiconductor storage device. As shown in this figure, the memory cell has a MOS transistor structure of a two-layer gate constructed of a control gate 701 and a floating gate 702. This memory cell is covered with an insulating film of $SiO_2$ or the like. This insulating film serves to provide electrical insulation of each portion that constitutes the memory cell, a function as a capacitor and protection from the external environment. A state in which a comparatively large number of electrons are injected into the floating gate 702 serves as a written state, where the memory cell has a high threshold value. A state in which a comparatively small number of electrons are injected into the floating gate 702 serves as an erased state, where the memory cell has a low threshold value. This difference between the threshold values is utilized for information storage. An operation for determining whether each memory cell is in the written state or in the erased state is a read operation.

Write into the memory cell, i.e., a transition from the erased state to the written state is achieved by injecting electrons into the floating gate.

There have been put into practice several methods for this purpose, and the write by injecting channel hot electrons (CHE) described below is most general. In concrete, by applying a high voltage (10 V, for example) to the control gate 701, applying a high voltage (6 V, for example) to the drain 705 and setting the source 703 to 0 V, a channel is formed to flow a large current between the drain 705 and the source 703. That is, electrons move from the source 703 to the drain 705. The electrons that have moved from the source 703 to the drain 705 become electrons in a high energy state due to the high voltage of the drain 705. If the energy at this time exceeds the energy barrier of an insulating film 704, then the electrons can move to the floating gate 702. With this mechanism, the memory cell is put in the written state by the injection of electrons into the floating gate 702.

On the other hand, the erase of the memory cell can be achieved by extracting the electrons accumulated in the floating gate 702. Several methods have been put into practice, and a method for extracting electrons from the source 703 is most general. According to this method, the electrons are moved by the tunnel effect from the floating gate 702 to the source 703, i.e., the memory cell is erased by, for example, making the control gate 701 have a voltage of 0 V, making the source 703 have a high voltage (12 V, for example) and floating the drain 705. This is the erase method called the high voltage source erase.

There is also put into practice a negative voltage gate erase, which is a kind of source erase and able to suppress the source voltage low. According to this erase method, the potential of the floating gate 702 is lowered by applying a negative voltage (−10 V, for example) to the control gate 701, applying a high voltage (5 V, for example) to the source 703 and floating the drain 705. According to this erase method, a similar tunnel effect can be obtained by a source voltage lower than that of the method of making the control gate 701 have a voltage of 0 V, and the memory cell erase can be achieved. This negative voltage gate erase is also an erase method that applies a high voltage to the source. In order to distinguish this method from the source erase that is not the negative voltage gate erase, there will be provided the description that the former is referred to as a negative voltage gate erase and the latter is referred to as a high voltage source erase in distinction.

Next, FIG. 9B shows the array structure of a flash memory. This figure shows the array structure of a NOR type flash memory, which is a typical flash memory. Row select lines 711, 712, 713, 714, 715, 716, ... are connected to the control gates of a plurality of memory cells, and column select lines 732, 731, ... are connected to the drains of the plurality of memory cells. The plurality of row select lines 711, ..., 716, ... and the plurality of column select lines 732, 731, ... constitute a matrix, forming a memory array. In the flash memory, the memory cells in an identical block share a source line 741, and this facilitates easy batch erase of the cells in a block and also enables a substantial reduction in the memory array area.

During write in this flash memory cell array, the write is effected only on the cell of which both the row select line and the column select line are selected, and therefore, write in bits can be achieved. In the case of division into blocks that respectively have a common source line as in a flash memory, erase is executed by block erase for erasing in a batch all the memory cells in a block. It is to be noted that the block erase can be achieved with a lower source voltage than in the case of the high voltage source erase when the negative voltage gate erase is used, and therefore, only the memory cell to the gate of which a negative voltage is applied can be erased. It is also possible to execute sector erase for selectively erasing only a specified sector by dividing the block that shares a source line into sectors that are more minute erase units.

During the source erase of an EEPROM, a tunnel current between bands (BTBT: Band-To-Band Tunneling current, referred to as a BTBT current hereinafter) described in detail later cannot be avoided in the overlap region of the floating gate and the source diffusion layer. Accordingly, there is a reduction in the current efficiency of the erase operation, i.e., the ratio of electric charges to be extracted from the floating gate with respect to the charges consumed by the high voltage applied to the source.

This BTBT current will be described with reference to FIGS. 10A and 10B.

FIG. 10A schematically shows the state in the vicinity of the source 703 in the aforementioned erase operation. This erase operation is achieved by extracting electrons from the floating gate 702 to the source 703 by the FN (Fowler-Nordheim) tunneling phenomenon. An electron A inside the floating gate 702 is moved to the source 703 by the voltage applied during erase according to the FN tunneling phenomenon. This movement of the electron A is the erase operation.

However, by applying a high voltage to the source 703, a potential slope, i.e., band bending is caused by an electric field that concentrates on the surface and its vicinities of the overlap portion of the floating gate 702 and the source 703. This increases the electron potential in a valence band, and if the potential becomes higher than the conduction band of the $N^+$ region, then there appears an electron (electron B in FIGS. 10A and 10B) that passes through the bandgap between the valence band and the conduction band by the band-to-band tunnel effect and moves to the conduction band. This is the BTBT current, occurring concurrently with a hole. FIG. 10B shows an energy band diagram of the state of electron energy at this time. The electron A is an electron that moves from the floating gate 702 to the source 703 during erase. The electron B moves in the direction of arrow as a consequence of an increase in the electron potential in the valence band due to band bending ψs. That is, the BTBT current is generated. Due to this BTBT current, the current efficiency of the erase operation of source erase deteriorates. The BTBT current not only reduces the current efficiency of the erase operation but also generates a hole, becoming an important factor to deteriorate the reliability of the memory cell. That is, due to the trap of the hole, which has been generated by the band-to-band tunnel effect, in the insulating film, the reliability of the insulating film 704 is degenerated.

Since the sources of all the memory cells in a block are connected to an identical source line in the flash memory in which the block batch erase is executed, an increase in the peak current due to the BTBT current becomes a serious problem. The reason for the above is that a portion that belongs to the consumption current during the erase operation and depends on the BTBT current is roughly proportional to the number of memory cells to which the erase voltage is simultaneously applied to the source. In addition, with regard to the flash memory, due to the fact that the device operable on a single power supply voltage is mainly used for the sake of improvement in operability and the fact that the power supply employed in portable equipment on the big market of the flash memory is limited, it is often the case where a voltage boosted from the power supply voltage by a charge pump circuit is used as a source voltage to be used for source erase. In order to generate a specified high voltage regardless of the low power supply voltage, a larger current is consumed. In addition, the boosting efficiency of a voltage booster circuit, i.e., a ratio of an output electric power to an input consumption power is generally reduced in accordance with a reduction in the power supply voltage. Therefore, an increase in the consumption current due to the BTBT current becomes still more serious problem in accordance with the adoption of a single power supply voltage and a low voltage.

Next, FIG. 11 shows an example of a booster circuit for generating a high voltage to be applied to the source during erase. In this FIG. 11, only the part necessary for explaining the boost is described.

The booster circuit shown in FIG. 11 includes a charge pump circuit 808 for effecting boost from a power supply voltage 801 and generating a boosted voltage 899. In this pump circuit 808, a plurality of sets of a capacitor and a transistor such as the sets of a capacitor 821 and a transistor 822 are connected in series in a plurality of stages. Then, a set constructed of a capacitor N3 and a transistor N4 serves as the final stage of the sets connected in series.

The oscillation circuit 802 of FIG. 11 alternately puts two signal lines 803 and 804 into an enable state. A buffering circuit 805 alternately thrusts nodes 806 and 807 up to the power supply voltage on the basis of signals from these signal lines 803 and 804. For example, in the capacitor 821, the node 806 being thrust up raises the potential of the other electrode, and the boosted charges pass through the transistor 822. This charges, which have passed through the transistor, are further boosted by the operation of the capacitor 823. By repeating this operation, the booster circuit shown in FIG. 11 can generate the higher voltage 899 on the basis of the power supply voltage 801.

Then, since the transistors 822, 824, . . . , N2, N4 and so on are connected so as to prevent the backward flow, the charges of which the potential has been raised by the capacitors flow toward an output node 888. By repeating this operation, the booster circuit of FIG. 11 generates the high voltage. The fundamental operation of the booster circuit is described above.

Next, FIG. 13 shows one example of the current waveform when the erase voltage is applied. It is needless to say that the consumption current is not entirely attributed to the BTBT current. The contents of the consumption current include a variety of elements such as a current consumed by a write state machine for the control of the erase operation and a current used for the voltage control of other than the source. However, during source erase, the consumption current attributed directly to the BTBT current is especially large, and it can be safely said that the greater part of the current that varies on the time base is attributed to the BTBT current. Therefore, no explanation is provided hereinafter for the current attributed to other than the BTBT current so long as the need does not arise.

The current efficiency of the erase operation is very low due to the BTBT current. Moreover, the potential of the floating gate rises as the erase progresses. This reduces the electron potential of this region, suppresses the peak of the potential in the valence band on the surface of the $N^+$ region and reduces the BTBT current. Therefore, the peak of the consumption current is located immediately after the application of the consumption voltage during the source erase, and the consumption current reduces according to the progress of the erase. Generally, in order to control the reduction in the power supply voltage attributed to the consumption of current, a capacitor is connected to the power supply outside the device. However, the erase time of the flash memory is very long (several milliseconds to several seconds), and it is not easy to secure a capacity sufficient for handling a large current for a long time. Due to this large peak current, it has been difficult to use a flash memory in a system such as portable equipment, which has only a small current supply capacity.

A concrete example of the execution of the negative voltage gate erase will be described more in detail with reference to FIG. 12. In the following description, a group constructed of a single or a plurality of row select lines is referred to as a row select line group, and a group constructed of a single or a plurality of column select lines is referred to as a column select line group. FIG. 12 shows only the part necessary for explaining the block erase of a nonvolatile semiconductor storage device capable of executing block erase. There are shown a memory array 910 that becomes an erase unit, a row decoder 920 for controlling the row select line group 921, a negative voltage 901 supplied to the row decoder, a debooster circuit 960 for generating the negative voltage 901, a column decoder 930 for controlling the column select line group 931, a source control circuit 940 for controlling the source line 941, a high voltage 902 supplied to the source control circuit 940 and a booster circuit 950 for generating the high voltage 902. In this case, the booster circuit 950 and the debooster circuit 960 have a construction similar to that of the aforementioned booster circuit shown in the FIG. 11. The row select line group 921 shown in FIG. 12 includes all of the row select lines connected to the memory cells included in the memory array 910. The column select line group 931 includes all of the column select lines connected to the memory cells included in the memory array 910.

When the erase of the memory array 910 is executed, the row decoder 920 applies the negative voltage 901 generated by the debooster circuit 960 to all the row select lines included in the row select line group 921. The source control circuit 940 applies the supplied high voltage 902 to the source line 941 of the memory array 910. The column select line group 931 is controlled so as to be floating by the operation of the column decoder 930 or a circuit that controls the drain voltage and is connected to the column decoder 930. Control of the drain voltage, which is not especially important in terms of the construction of the present invention, is not shown in FIG. 12. By the application of these voltages, all the memory cells included in the memory array 910 receive the negative voltage applied to their control gates and the high voltage applied to their sources and have the drain floating. This is the conventional erase operation, and the consumption current roughly becomes as shown in FIG. 13.

During the negative voltage gate erase, the sector erase can be achieved as described hereinabove. According to this method, erase is executed not on the entire block, and a negative voltage is applied only to a part of the row select lines connected to the erase block. The memory cells connected to the row select line to which this negative voltage is applied are erased, and a BTBT current is generated. On the other hand, the memory cells connected to the row select line to which the negative voltage is not applied are not erased since the electron potential of the floating gate is lowered. Furthermore, since the electron potential of the valence band in the vicinity of the $N^+$ surface of the source is not significantly raised, the BTBT current is largely reduced. However, according to this method, the erase time is increased for the execution of the erase of the entire block. For example, when the erase is executed half-and half with regard to the number of sectors included in a block in order to suppress about half the peak current, twice the erase time is simply required.

Moreover, the BTBT current can be reduced by the channel erase method. According to the channel erase, the erase operation is achieved by extracting the electron in the floating gate to the substrate with a negative voltage applied to the control gate and with a positive voltage applied to the substrate. According to this method, the BTBT current can almost be removed. However, due to the necessity of substrate potential control, there is needed a substantial change of the manufacturing process and the control method, which cannot easily be achieved.

Moreover, the BTBT current can also be suppressed by setting low the source voltage during erase. However, there is a demerit that the time required for the erase largely increases by simply lowering the source voltage.

Accordingly, a technology for restraining the increase of the erase time to a minimum while suppressing the peak current is soft erase. This soft erase, which is originally a technology intended for improving the reliability of the memory cell, also serves as a means for suppressing the BTBT current ascribed to the hole generating mechanism during erase and is also effective for a reduction in the erase current.

During this soft erase, the source voltage is set lower than usual for a certain period from the start of the erase operation, and the source voltage is set back to the normal voltage after the progress of the erase operation to a certain extent. Since the source voltage is low immediately after the application of the erase voltage when the BTBT current is maximized, the peak current is suppressed. When the source voltage is set back to the normal erase voltage, the peak current does not increase so much because the erase has progressed to a certain extent.

However, it is very difficult to quantitatively grasp the correlation between the source voltage and the peak current value if the variations of the process, the deterioration of the memory cells and so on are taken into consideration. Moreover, the same thing can be said for the quantitative correlation between the erase time and the source voltage. Therefore, it can be qualitatively estimated to reduce the peak current by the soft erase, but a quantitative determination is difficult.

Accordingly, as a means for enabling the quantitative estimation of the suppression of the consumption current peak, there is proposed a method for limiting the consumption current of the source voltage generation circuit. This method is a method for providing the source voltage generation circuit with a current limiting means. This technology pays attention to the fact that the consumption current attributed to the BTBT current is consumed by the booster circuit for generating the source voltage. The high voltage generated by the booster circuit flows a current to the substrate in the form of the BTBT current. However, when the electric charges lost by the BTBT current cannot be replenished, the source voltage is lowered due to limitations on the consumption current of the booster circuit, and a soft erase state is established.

Then, the source voltage automatically rises when the BTBT current is reduced with the progress of erase. By using this method, the consumption current attributed to the BTBT current can reliably be suppressed by the required amount. If the consumption current due to the BTBT current is desired to be suppressed to a half, it is proper to limit the consumption current of the booster circuit to a half.

However, since the source voltage during erase is not specified by this method, it is very difficult to estimate the required erase time.

Next, a prior art example of the operation of erasing a plurality of blocks will be described with reference to FIGS. 14 and 15. FIG. 14 shows only a part that belongs to a nonvolatile semiconductor storage device capable of executing block erase and is necessary for explaining the erase of the plurality of blocks. A block 1070 and a block 1075, which are the erase blocks, have respective memory arrays 1010 and 1015 and the peripheral circuits thereof. That is, the block 1070 is constructed of a memory array 1010 that becomes an erase unit, a row decoder 1020 for controlling a row select line group 1021 of the memory array 1010, a column decoder 1030 for controlling a column select line group 1031 of the memory array 1010 and a source control circuit 1040 for controlling a source line 1041 of the memory array 1010.

Likewise, the block 1075 is constructed of a memory array 1015 that becomes an erase unit, a row decoder 1025 for controlling a row select line group 1026 of the memory array 1015, a column decoder 1035 for controlling a column selection group 1036 of the memory array 1015 and a source control circuit 1045 for controlling a source line 1046 of the memory array 1015.

Furthermore, a debooster circuit 1060 shown in FIG. 14 supplies a negative voltage 1001 to the row decoders 1020 and 1025 provided for a plurality of blocks 1070 and 1075, while a booster circuit 1050 supplies a high voltage 1002 to the source control circuits 1040 and 1045 of the blocks 1070 and 1075. In this case, the debooster circuit 1060 and the booster circuit 1050 have a construction similar to that of the aforementioned booster circuit shown in FIG. 11.

The row select line groups 1021 and 1026 shown in FIG. 14 include all the row select lines connected to the memory cells included in the memory arrays 1010 and 1015. The column select line groups 1031 and 1036 include all the column select lines connected to the memory cells included in the memory arrays 1010 and 1015.

These memory arrays 1010 and 1015 are the two of the plurality of memory arrays included in this semiconductor storage device. When the storage contents of either one of these memory arrays 1010 and 1015 are erased, the storage contents of a single memory array are erased according to one example by the operation already explained with reference to FIG. 12.

In this case, a prior art example of the erase voltage applying method when both the memory arrays 1010 and 1015 are concurrently erased will be described with reference to FIG. 15.

Between a time t0 and a time t1, an erase voltage (−10 V, for example) is applied to the row select line group 1021, and an erase voltage (5 V, for example) is applied to the source line 1041. Between the time t1 and a time t2, an erase voltage is applied to the row select line group 1026, and an erase voltage is applied to the source line 1046. As a consequence of this series of operations, the storage contents of the memory cells connected to the memory array 1010 are erased between the time t0 and the time t1, and the storage contents of the memory cells connected to the memory array 1015 are erased between the time t1 and the time t2. Therefore, the storage contents stored in the two memory arrays 1010 and 1015 are entirely erased.

Although the case of the erase of the two blocks 1070 and 1075 has been described with reference to FIGS. 14 and 15, the erase can be executed by a method similar to the aforementioned method when erasing three or more blocks. According to the erase method described with reference to FIG. 15, the time of erase is roughly proportional to the number of blocks erased.

Then, one example of the method for erasing two blocks at a higher speed will be described with reference to FIG. 16. As shown in FIG. 16, between the time t0 and the time t1, the row line voltage during erase is applied to both of the row select line groups 1021 and 1026, and a source line voltage during erase is applied to both of the source lines 1041 and 1046. By this operation, between the time t0 and the time t1, the storage contents of the memory cells included in both the memory arrays 1010 and 1015 are erased. Therefore, according to the erase method shown in FIG. 16, the erase can be executed at a higher speed than in the case of the aforementioned erase method shown in FIG. 15. Although the case of the erase of the two blocks has been described with reference to FIG. 16, the erase voltage can similarly be simultaneously applied to three or more blocks.

However, the erase method shown in FIG. 16 has the problems as follows. That is, the first problem is that the sum total of the BTBT current flowing from the sources of the memory cells is increased by an increase in the number of memory cells to be simultaneously erased, and when the sum of the currents exceeds the current supply capacity of the booster circuit 1050, the potential of the high voltage 1002 cannot be maintained, hindering the erase operation. The second problem is that the number of blocks that can be simultaneously erased is limited also by a resistance that accompanies the high voltage 1002. The limitations will be described with reference to FIG. 18.

FIG. 18 shows a model of the source line when four blocks 1170a, 1170b, 1170c and 1170d are provided as a concrete example of the nonvolatile semiconductor storage device that has a plurality of blocks. The blocks 1170a, b, c and d are each provided with a memory array and its peripheral circuits, which are collectively shown in the form of blocks in FIG. 18. Moreover, a circuit for applying a voltage to the row line group and a control circuit are required for the erase operation. FIG. 18 shows elements necessary for explaining the limitations on the number of erase blocks due to the resistance of the source line.

As shown in FIG. 18, this nonvolatile semiconductor storage device includes a booster circuit 1150 for generating a source voltage during erase, four blocks 1170a through 1170d that become an erase unit and the resistances 1180a through 1180d of the source lines. This booster circuit 1150 generates a high voltage 1102 and supplies high voltages 1102a through 1102d to the blocks 1170a through 1170d. The resistances 1180a through 1180d of the source lines are caused by the wiring of the node, switching elements and so on and do not normally become zero. The parasitism of the source resistance also changes depending on the arrangement of the blocks, and the case of resistances parasitic in series will be described as the most comprehensible example.

In this case, as one example for simplicity, it is assumed that the resistances 1180a through 1180d are all 10 Ω, each of the blocks 1170a through 1170d consumes a current of 10 mA at a maximum from the source during erase, the source voltage during erase is permitted to drop to 0.4 V from the voltage generated by the booster circuit 1150, and the current supply capacity of the booster circuit 1150 is sufficient.

For example, when the erase of the block 1170a is executed, the currents flowing through the resistances 1180a through 1180d are 10 mA, 0 mA, 0 mA and 0 mA, respectively. A voltage drop due to a resistance becomes the product of the resistance value and the current value, and therefore, the voltage 1102a becomes a voltage dropped by 0.1 V from the voltage 1102. Since this drop voltage is within a permissible range, the erase can be achieved. Likewise, with regard to the blocks 1170b through 1170d, the voltages 1102b, 1102c and 1102d applied to the sources become the voltages dropped by 0.2 V, 0.3 V and 0.4 V, respectively, from the voltage 1102. The voltages are within a permissible range.

The case where the four blocks of the blocks 1170a through 1170d are required to be all erased in order to execute the erase of a plurality of blocks (i.e., multi-block erase) at high speed will be described next. If an erase voltage is simultaneously applied to all of the blocks 1170a through 1170d, the currents flowing through the resistances 1180a through 1180d become 40 mA, 30 mA, 20 mA and 10 mA, respectively. Consequently, the source voltages 1102a through 1102d drop from the high voltage 1102 to 0.4 V, 0.7 V, 0.9 V and 1.0 V. The drop of the source voltages of the blocks 1170b through 1170d described above exceeds the permissible range and possibly hinders the erase operation. Therefore, even if the booster circuit 1150 has a sufficient current supply capacity, it is not allowed to simultaneously apply the erase voltage to the four blocks 1170a through 1170d.

Furthermore, when the erase voltage is simultaneously applied to the two blocks of the aforementioned four blocks, there inevitably occurs a situation that the voltage drop on the source line exceeds the permissible range no matter which combination is selected. Therefore, when erasing these four blocks 1170a through 1170d, there has been repeated four times the erase operation of one block.

This source resistance can be reduced by reducing the sheet resistance of the wiring layer of the source line, shortening the source line wiring and increasing the capacity of the switching element when the switching element is employed. As a method for reducing this sheet resistance, the reduction can be achieved by devising the material and thickness of the wiring layer. However, the devising, which requires a change of process, is generally not easy. Moreover, shortening the source wiring has limitations attributed to the layout arrangement of the blocks and so on. Moreover, thickening the source wiring width and increasing the switching element capacity lead to an increase in the chip area, and there is a concern about the sacrifice of the chip size and cost. Therefore, it is unavoidable that a resistance is parasitic on the source line to a certain extent, and this parasitic resistance possibly limits the simultaneous erase of a plurality of blocks.

As described above, there have been limitations on the simultaneous erase of a plurality of blocks due to the current supply capacity of the booster circuit that generates the high voltage applied to the source and the resistance parasitic on the source line.

As described above, according to the conventional source erase method, the peak value of the consumption current during erase is large, and there is a serious hindrance to the use of the method in portable equipment whose current supply capacity is not sufficiently large and the like.

Moreover, the substrate erase, which is the erase method that causes no BTBT current, requires substrate potential control, and therefore, a special process and control must be prepared.

Moreover, according to the method for reducing the peak current by soft erase, it is generally difficult to quantitatively estimate the correlation between the applied source voltage and the peak current value. Using the technology of limiting the consumption current of the booster circuit is also effective for the suppression of the consumption current, but it is difficult to estimate the time necessary for erase.

Moreover, it has conventionally been difficult to execute batch erase of a plurality of blocks, and when only a single block can be simultaneously erased, the time necessary for erasing a plurality of blocks has been increased roughly in proportion to the number of blocks in which the erase is executed.

SUMMARY OF THE INVENTION

Accordingly, the object of the present invention is to provide a nonvolatile semiconductor storage device capable of quantitatively estimating the required erase time and the peak value of an erase current, suppressing an increase in the erase time and reducing the erase current and a storage contents erase method therefor. The present invention also provides a method capable of efficiently executing the erase of a plurality of blocks.

In order to achieve the above object, according to the present invention, there is provided a nonvolatile semiconductor storage device having a memory array constructed of a plurality of memory cells, a row select line control circuit, a column select line control circuit and a source line control circuit for controlling row select lines, column select lines and source lines respectively connected to each of the memory cells and a voltage generation circuit for individually generating voltages to be applied to the row select line and the source line, the memory array being subjected to erase by applying specified voltages to the row select line and the source line, wherein the row select line control circuit comprises a line group independent control means capable of independently controlling a plurality of row select line groups each of which is constructed of at least one row select line, and the voltage generation circuit comprises a consumption current limiting means for limiting a consumption current of the voltage generation circuit.

In this invention, the line group independent control means independently controls a plurality of row select line groups, and voltages generated by the voltage generation circuit are applied to the individual row select line groups with time shifts. As a result of this, the peak of consumption current can be suppressed, so that the consumption current can be reduced.

Further, in this invention, the consumption current limiting means of the voltage generation circuit limits the consumption current of the voltage generation circuit, allowing voltages to be generated within a range under a specified current value according to the conditions of voltage application from the voltage generation circuit to the individual row select line groups. Thus, a further reduction in consumption current at a shorter scale can be achieved.

In one embodiment, there is provided a nonvolatile semiconductor storage device having a memory array constructed of a plurality of memory cells, a row select line control circuit, a column select line control circuit and a source line control circuit for controlling row select lines, column select lines and source lines respectively connected to each of the memory cells and a voltage generation circuit for individually generating voltages to be applied to the row select line and the source line, the memory array being subjected to erase by applying specified voltages to the row select line and the source line, wherein the source line control circuit comprises an independent control means capable of independently controlling a plurality of source lines, and the voltage generation circuit comprises a consumption current limiting means for limiting a consumption current of the voltage generation circuit.

In this one embodiment, the independent control means independently controls a plurality of source lines, and voltages generated by the voltage generation circuit are applied to the individual source lines with time shifts. As a result of this, the peak of consumption current can be suppressed, so that the consumption current can be reduced.

Further, in this embodiment, the consumption current limiting means of the voltage generation circuit limits the consumption current of the voltage generation circuit, allowing voltages to be generated within a range under a specified current value according to the conditions of voltage application from the voltage generation circuit to the individual source lines. Thus, a further reduction in consumption current at a shorter scale can be achieved.

In another embodiment, the consumption current limiting means is constructed of:

an output current limiting means.

In this embodiment, since the consumption current limiting means is implemented by the output current limiting circuit, the voltage generation means outputs voltages within a range under a specified current by virtue of operations of this limiting circuit. As a result of this, output current load is limited, drops due to load currents are reduced, and the power supply capability of the voltage generation means is alleviated, so that the consumption current is limited. This function of reducing the consumption current enables the voltage generation means to be optimum for the source voltage generation circuit in block erase operations in rewritable nonvolatile semiconductor storage devices.

In an embodiment, the consumption current limiting means is constructed of:

an input current limiting circuit.

In this embodiment, since the consumption current limiting means is implemented by an input current limiting circuit, the consumption current can be reduced by limiting the current of the power supply current of the voltage generation means.

In another embodiment, the consumption current limiting means activates only partially the voltage generation circuit.

In this embodiment, since the consumption current limiting means activates only partially the voltage generation circuit, the consumption current of the voltage generation circuit is reduced. This function of reducing the consumption current enables the voltage generation circuit to be optimally usable for the source voltage generation circuit in block erase operations.

In an embodiment, there is provided a storage contents erase method for a nonvolatile semiconductor storage device comprising the step of:

changing a number of row select line groups to which a specified voltage necessary for erase is simultaneously applied by the line group independent control means according to a specified condition before the erase of all the memory cells in the memory array is completed among a plurality of row select line groups capable of being independently controlled.

In this embodiment, the number of row select line groups to which a specified voltage required for erase is simultaneously applied is changed over according to predetermined conditions before the erase of all the memory cells within the memory array is completed. As a result of this, a reduction in peak value of the consumption current can be achieved.

In another embodiment, there is provided a storage contents erase method for a nonvolatile semiconductor storage device comprising the step of:

changing a number of source lines to which a specified voltage necessary for erase is simultaneously applied by the independent control means according to a specified condition before the erase of all the memory cells in the memory array is completed among a plurality of source lines capable of being independently controlled.

In this embodiment, among a plurality of source lines that can be controlled independently by the independent control means, the number of source lines to which a specified voltage required for erase is simultaneously applied is changed over according to predetermined conditions before the erase of all the memory cells within the memory array is completed. As a result of this, a reduction in peak value of the consumption current can be achieved.

In an embodiment, the number of the row select line groups or the source lines to which the specified voltage necessary for the erase is simultaneously applied is changed every time a consumption current in the voltage generation circuit for generating the specified voltage becomes not higher than a specified value.

In this embodiment, a reduction of peak value of the consumption current can be achieved.

In another embodiment, the number of the row select line groups or the source lines to which the specified voltage necessary for the erase is simultaneously applied is changed every predetermined time.

In this embodiment, a reduction in peak value of the consumption current can be achieved.

In an embodiment, the number of the row select line groups or the source lines to which the specified voltage necessary for the erase is simultaneously applied is changed every time a threshold voltage of an objective memory cell to be erased becomes not higher than a specified value.

In this embodiment, the number of row select line groups or source lines to which the erase voltage is applied is changed over stepwise in an erase operation. Thus, the peak consumption current can be reduced efficiently.

In another embodiment, overerase verify after an erase operation is executed after completing the erase operation of all objective memory cells to be erased.

In this embodiment, after the erase operation of all the memory cells that are targeted for erase is completed, an overerase verify subsequent to this erase operation is executed. Therefore, the memory cells never undergo any erase disturb after the overerase verify. As a consequence, it can be ensured that the threshold voltages of the memory cells fall within a reference threshold voltage range that has been checked at the time of the overerase verify. That is, according to this embodiment, a verify precision equivalent to that of the conventional batch erase method can be obtained.

In an embodiment, erase is executed by switchover between an erase method for erasing in a batch a block of a memory cell area selected by the row select line group and the source line by controlling all the row select line groups in an identical operation and controlling all the source lines in an identical operation and the storage contents erase method.

With the erase method of this embodiment, it becomes possible to change over between the conventional block erase and the above-described erase method for reducing the consumption current peak, in accordance with the current supply capability of the power supply.

In another embodiment, a nonvolatile semiconductor storage device further comprises an erase method switchover means for executing the erase by switchover between an erase method for erasing in a batch a block of a memory cell area selected by the row select line group and the source line by controlling all the row select line groups in an identical operation and controlling all the source lines in an identical operation and the storage contents erase method.

In the nonvolatile semiconductor storage device of this embodiment, it becomes possible to change over between the conventional block erase and the above-described erase method for reducing the consumption current peak, in accordance with the current supply capability of the power supply.

In an embodiment, there is provided a nonvolatile semiconductor storage device storage contents erase method for executing erase of storage contents of a nonvolatile semiconductor storage device having a plurality of memory blocks including a memory array constructed of a plurality of memory cells, a row select line control circuit, a column select line control circuit and a source line control circuit for respectively controlling row select lines, column select lines and source lines respectively connected to each of the memory cells in each of the memory blocks and a voltage generation circuit for individually generating voltages to be applied to the row select line and the source line, by applying specified voltages to the row select line and the source line, comprising the steps of:

concurrently selecting the row select lines connected to the memory block by the row select line control circuit;

concurrently selecting the source lines connected to the memory block by the source line control circuit; and changing according to a specified condition a number of the memory blocks to the row select lines of which a specified voltage necessary for erase is simultaneously applied until the erase of all the memory cells included in the memory block in which the erase is executed is completed.

In this embodiment, the number of memory blocks to row select lines of which a specified voltage required for erase is simultaneously applied is changed over according to predetermined conditions. Thus, while increases in erase time are suppressed, a reduction in the consumption current can be achieved, so that the erase of a plurality of blocks can be executed efficiently.

In an embodiment, the number of the memory blocks to the row select lines or the source lines of which the specified voltage necessary for the erase is simultaneously applied is changed every time a consumption current in the voltage generation circuit for generating the specified voltage becomes not higher than a specified value.

According to this embodiment, while increases in erase time are suppressed, a reduction in the consumption current can be achieved and the peak consumption current can be reduced efficiently, so that the erase of a plurality of blocks can be executed efficiently.

In an embodiment, the number of the memory blocks to both the row select line groups and the source lines of which an erase voltage is simultaneously applied is varied with a block in which the connected source line has a comparatively large wiring resistance and with a block in which the connected source line has a comparatively small wiring resistance.

According to this embodiment, while drops of the source voltage in an erase operation are suppressed, a shortening of the erase time can be achieved and a speedup of erase of a plurality of blocks can be achieved.

In an embodiment, the blocks to which the erase voltage is simultaneously applied are selected so that a maximum value of a potential drop from an output of the voltage generation circuit for generating a voltage to be applied to the source line inputted to the block in which erase is executed falls within a predetermined permissible range.

According to this embodiment, while drops of the source voltage in an erase operation are suppressed to within a permissible range, a shortening of erase time can be achieved and a speedup of erase of a plurality of blocks can be achieved.

In an embodiment, the erase of the memory array in the objective block to be erased is executed by the erase method.

In this embodiment, memory arrays within a block targeted for erase can be erased with high efficiency.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 20 is a voltage and current waveform diagram representing an erase operation in an eighth embodiment of the invention.

DETAILED DESCRIPTION OF THE PREFERRED EMBODIMENTS

Embodiments of the present invention will be described in detail below with reference to the drawings.

(First Embodiment)

Figure 1A:
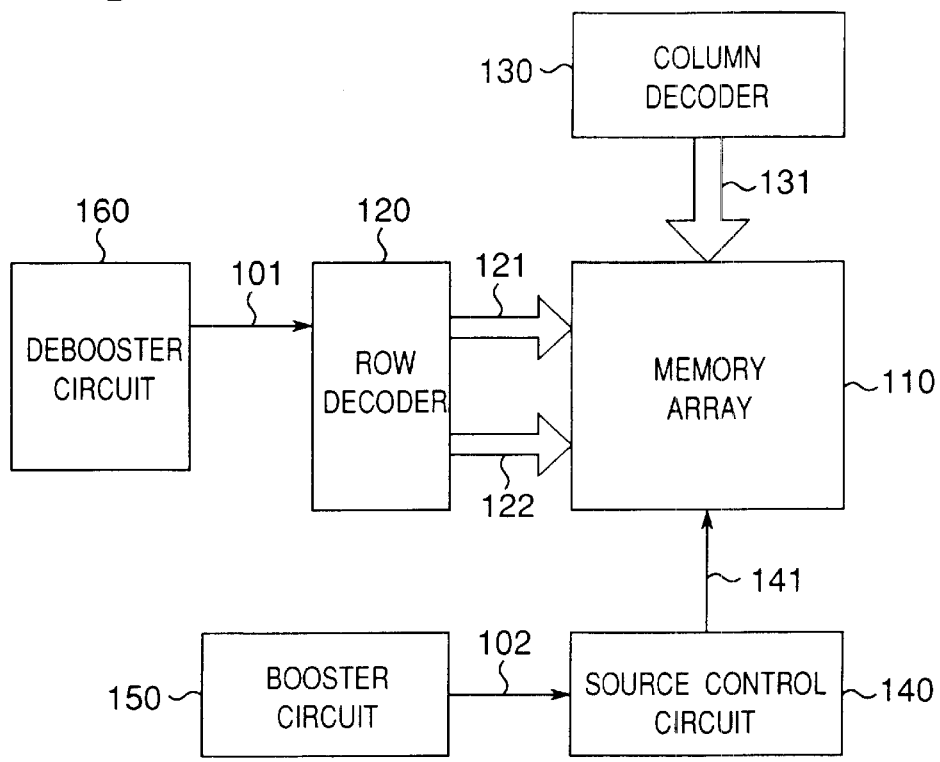
FIG. 1A is a block diagram for explaining an erase method in a first embodiment of the invention.

The first embodiment of the nonvolatile semiconductor storage device of this invention will be described with reference to FIGS. 1A and 1B. FIG. 1A shows only the part of the nonvolatile semiconductor storage device of the first embodiment capable of executing block erase, the part being necessary for explaining this invention.

This first embodiment is provided with a memory array 110 that becomes an erase unit, a row decoder 120 for controlling a row select line group 121 and a row select line group 122 and a debooster circuit 160 for generating a negative voltage 101 to be supplied to the row decoder 120. This first embodiment is further provided with a column decoder 130 for controlling a column select line group 131, a source control circuit 140 for controlling a source line 141 and a booster circuit 150 for generating a high voltage 102 to be supplied to the source control circuit 140.

The row select line group 121 and the row select line group 122 are respectively constructed of a plurality of row select lines, while the column select line group 131 is constructed of a plurality of column select lines. Although FIGS. 1A and 1B show an example in which the row select lines connected to the memory array 110 are divided into two row select line groups 121 and 122, it is also possible to further reduce the peak of a consumption current by division into three or more groups as described later. Therefore, it is needless to say that this invention is not limited to the case where the row select lines are divided into two groups. Herein is provided the description of only the case of division into two groups as one example.

In this first embodiment, when the erase of the memory array 110 is executed, the source control circuit 140 first applies the high voltage 102 supplied from the booster circuit 150 to the source line 141 of the memory array 110. The column select line group 131 is controlled so as to become floating by the column decoder 130 (or another circuit for controlling the source voltage connected to the column decoder 130 although not specifically shown).

In this erase operation, the row decoder 120 applies the negative voltage 101 supplied from the debooster circuit 160 to the row select line group 121 and the row select line group 122. This application is executed so that a period during which the negative voltage is applied to the row select line group 122 starts when a period during which the negative voltage is applied to the row select line group 121 ends, as shown in the waveform diagram of FIG. 1B.

Although not specifically shown, the timing control of this negative voltage application can be executed by a write state machine that is built in the nonvolatile semiconductor storage device and controls the internal operation including the erase operation, or the row decoder 120 can be provided with a control function therefor. In the actual erase operation, a different voltage is applied for verify or the like besides the application of the erase voltage. FIG. 1B shows the waveforms of the erase voltages to be applied.

Figure 1B:
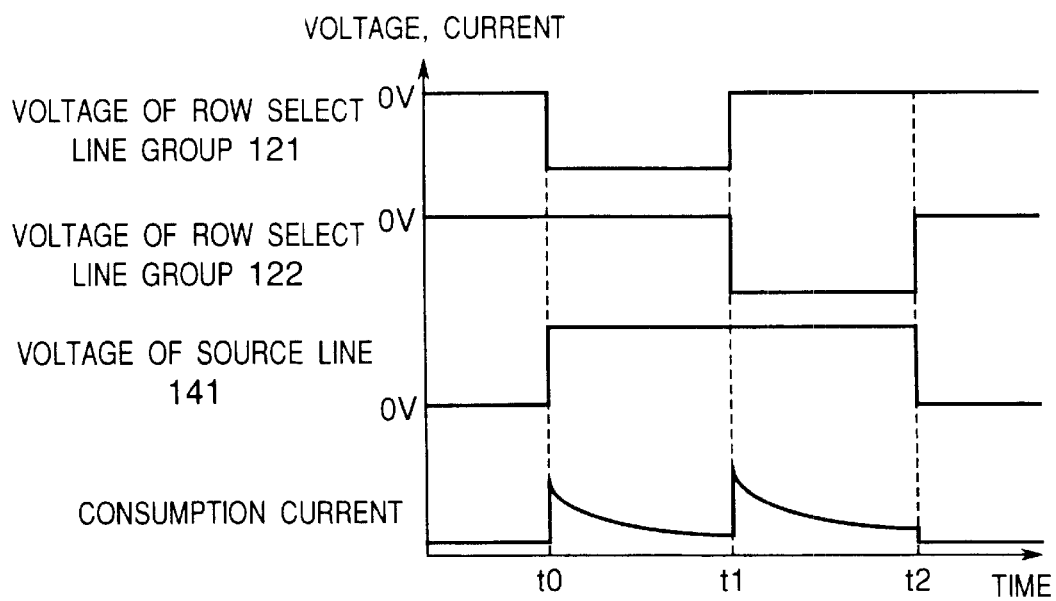
FIG. 1B is a waveform diagram showing a waveform of applied voltage and a waveform of consumption current in an erase operation by the method.

As shown in FIG. 1B, the negative voltage is applied to the row select line group 121 from the time t0 when erase starts to the time t1, and the negative voltage is not applied to the row select line group 122. Next, during a period from the time t1 to the time t2, the negative voltage is not applied to the row select line group 121, and the negative voltage is applied to the row select line group 122. Although the row select lines to which the negative voltage is not applied are assumed to have a voltage of 0 V for the sake of explanation, this invention is not limited to this. For example, it is also possible to apply a negative voltage for sufficiently reducing the BTBT current to these row select lines to which the negative voltage is not applied, and it is also possible to apply a positive voltage depending on the circuit construction of the row decoder 120.

FIG. 1B shows the waveforms obtained when the end of the negative voltage application to the row select line group 121 and the start of the negative voltage application to the row select line group 122 are concurrently executed at the time t1. However, the end and start of voltage application are not always limited to the execution thereof in accordance with the same timing, and it is proper to set the timing so that the period of negative voltage application to the row select line group 121 and the period of negative voltage application to the row select line group 122 do not overlap each other. The same thing can be said for the timing described hereinafter.

Figure 10A:
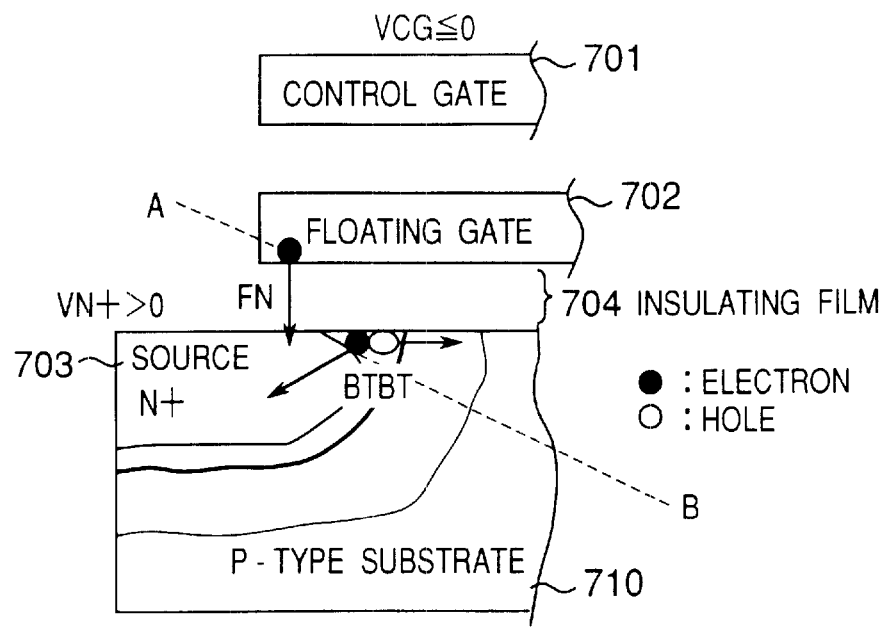
FIG. 10A is a schematic diagram for explaining BTBT current in an EEPROM.
Figure 10B:
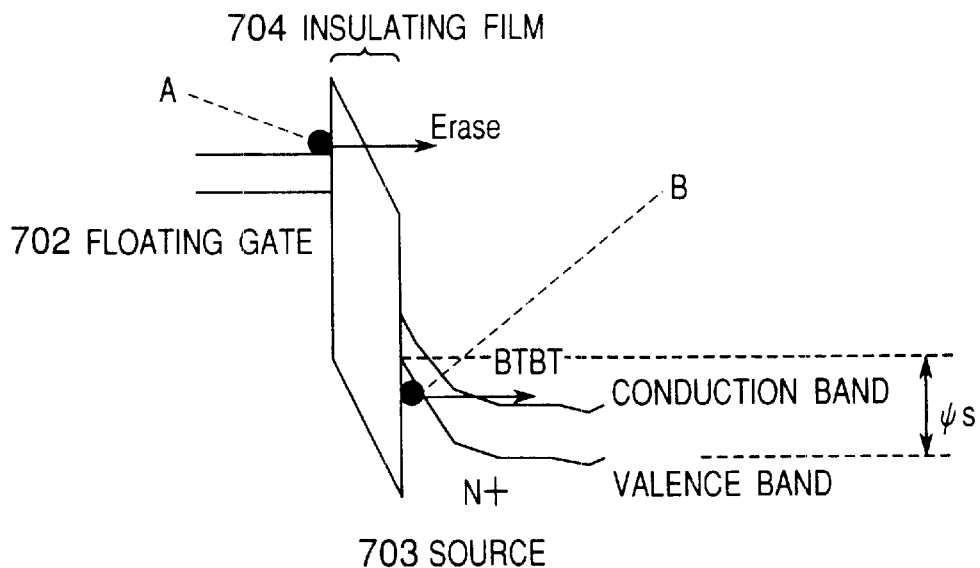
FIG. 10B is an energy band diagram for explaining the BTBT current.

In FIG. 1B, the negative voltage is supplied to the row select line group 121 during the period of the time t0 to the time t1, while the row select line group 122 is not supplied with the negative voltage but set to, for example, a voltage of 0 V. At this time, the memory cells connected to the unselected row select line group 122 have a higher control gate potential than that of the memory cells connected to the row select line group 121, and therefore, the floating gate potential also becomes high. The high potential means the low electron potential. Therefore, the band bending $\psi s$ between the floating gate and the source shown in FIG. 10B is reduced, and the BTBT current becomes extremely small. Therefore, during this period of t0 to t1, the consumption current of the high voltage 102 is determined only by the BTBT current of the selected memory cells connected to the row select line group 121.

During the next period of the time t1 to the time t2, the BTBT current of the memory cells connected to the row select line group 122 occupies the greater part of the consumption current of the high voltage 102 according to quite the same mechanism as described above.

Figure 13:
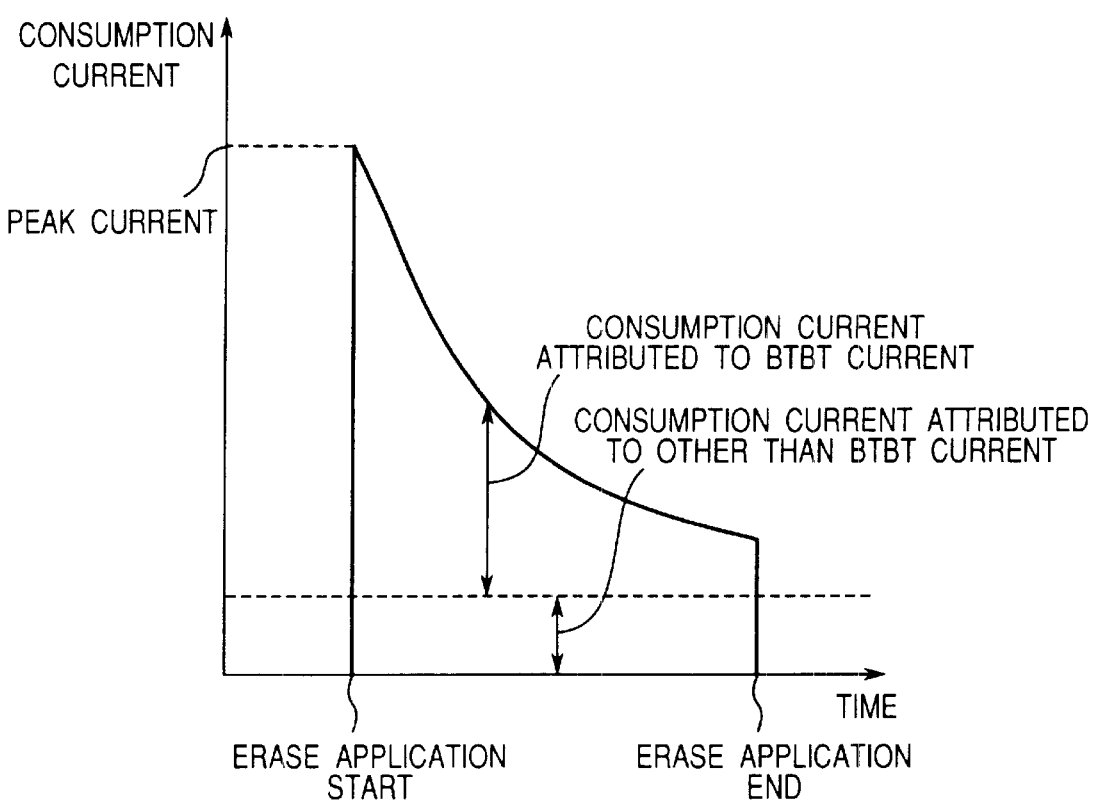
FIG. 13 is a current waveform diagram representing an example of consumption current in a source erase operation according to the prior art.

As described above, by the reduction in the BTBT current, the consumption current shown in FIG. 13 can be reduced. However, immediately after the start of the operation of the booster circuit 150, it is required to accumulate electric charges in the parasitic capacitance and the like on the wiring for supplying the high voltage 102. Accordingly, there is no change of the fact that the peak current value on a time scale shorter than that shown in FIG. 13 is the maximum current during the operation of the booster circuit 150.

The peak current value on the short time scale can also be reduced by employing a booster circuit described later.

The consumption current of the high voltage 102 is also reduced by the reduction in the BTBT current as described above. Therefore, by employing the booster circuit described later, the source voltage level is not lowered even when the current load that tolerates the high voltage 102 is reduced.

Moreover, by further increasing the number of divisions of the row select line groups and reducing the current supply capacity of the booster circuit 150 according to it (i.e., reducing the consumption current of the booster circuit 150), the peak current value in the erase operation can further be reduced.

It is to be noted that the rise time of the high voltage 102 is prolonged by reducing the current supply capacity of the booster circuit 150. This rise time is normally very short in comparison with the erase time (several hundred milliseconds) and does not matter at all.

By the method of applying the negative voltage to the row select line group as shown in the waveform diagram of FIG. 1B, the current consumption becomes roughly as indicated by the erase current waveform shown in the lowermost tier of FIG. 1B. In FIG. 1B, the maximum peak current in the erase operation, i.e., the consumption current at the time t0 and the time t1 becomes about a half of the conventional consumption current peak shown in FIG. 13. Although this figure is schematic to the utmost, it is apparent that the peak of the erase current can be reduced by this embodiment.

This embodiment is also able to easily execute block batch erase similar to the conventional one by simultaneously applying the erase voltage to the row select line group 121 and the row select line group 122. In order to achieve this, it is proper (1) that the row decoder 120 has a means for simultaneously applying a consumption voltage to the row select line group 121 and the row select line group 122 and (2) that the erase voltage is simultaneously applied to both the row select line group 121 and the row select line group 122 by controlling the row decoder 120 by a user interface circuit (not shown), a write state machine (not shown likewise) for controlling the flow of erase or the like when a batch erase command is received from the outside.

(Second Embodiment)

Figure 2A:
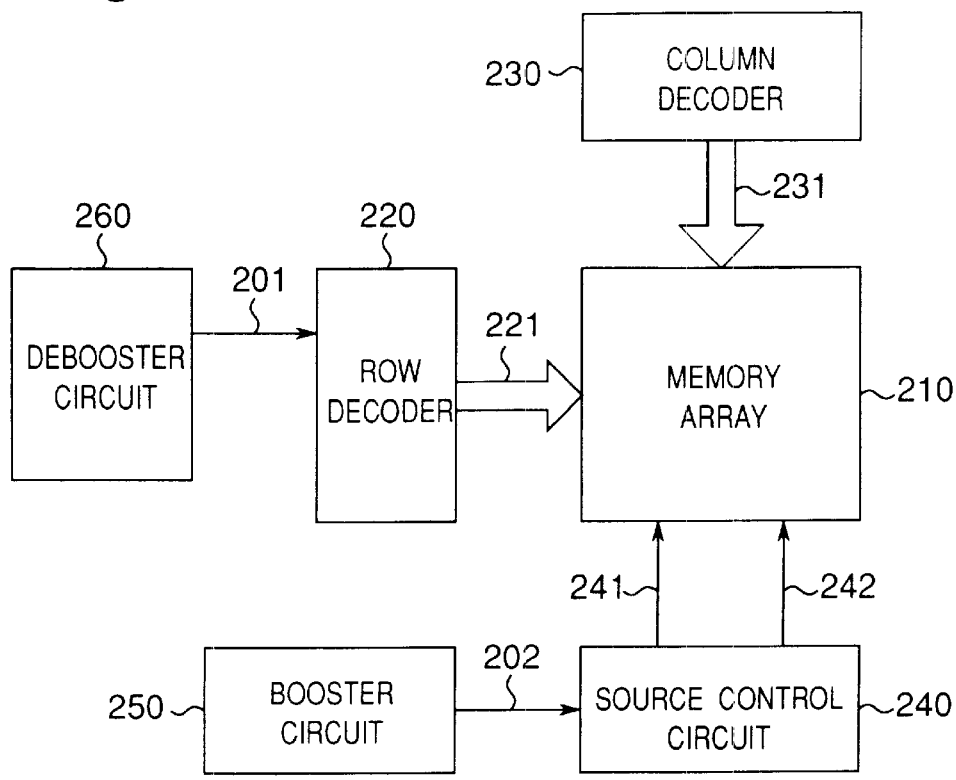
FIG. 2A is a block diagram for explaining an erase method in a second embodiment of the invention.

Next, the second embodiment of this invention will be described with reference to FIGS. 2A and 2B. FIG. 2A shows only the part of the nonvolatile semiconductor storage device capable of executing block erase, the part being necessary for explaining the second embodiment of this invention.

This second embodiment is provided with a memory array 210 that becomes an erase unit, a row decoder 220 for controlling a row select line group 221 and a debooster circuit 260 for generating a negative voltage 201 to be supplied to the row decoder 220. This second embodiment is further provided with a column decoder 230 for controlling a column select line group 231, a source control circuit 240 for controlling a source line 241 and a source line 242 and a booster circuit 250 for generating a high voltage 202 to be supplied to this source control circuit 240.

The row select line group 221 is constructed of a plurality of row select lines, while the column select line group 231 is constructed of a plurality of column select lines. Although the case of two source lines will be described in connection with this embodiment, it is also possible to increase this number, similarly to the division of the row select line group in the first embodiment.

Figure 3A:
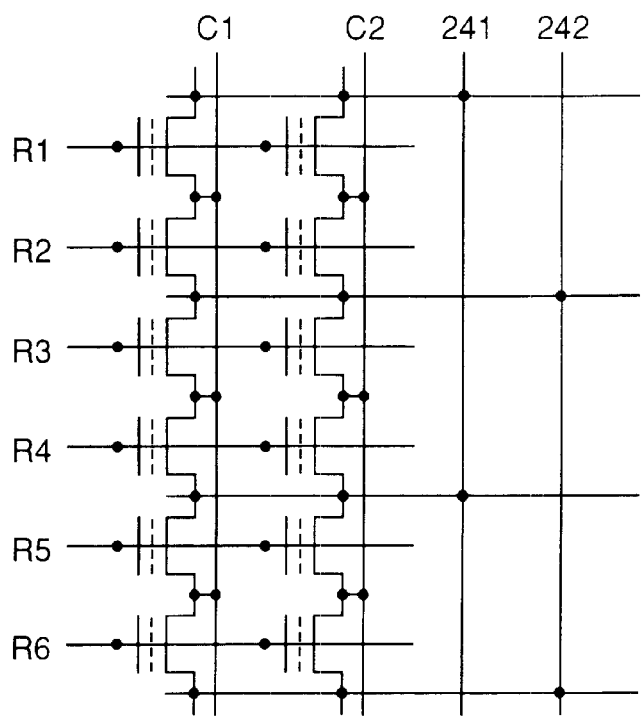
FIG. 3A is a circuit diagram showing an example of the memory array structure in the first and second embodiments.
Figure 3B:
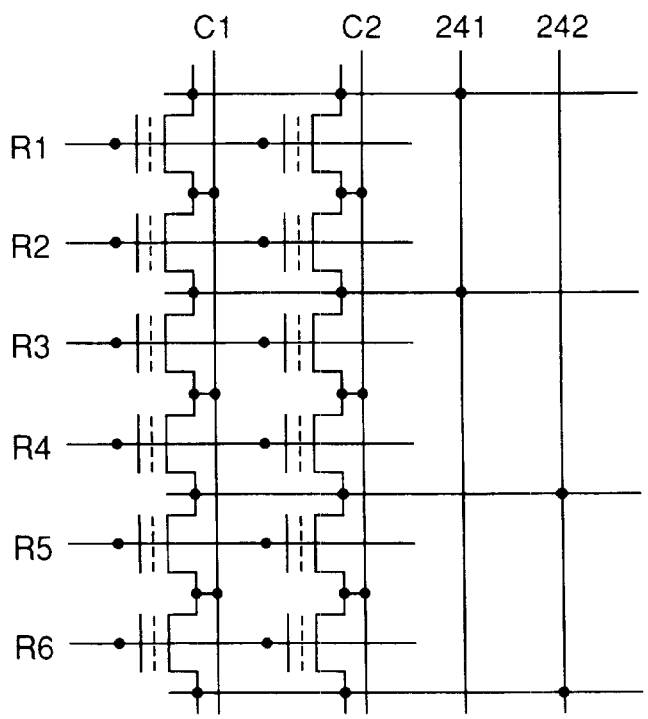
FIG. 3B is a circuit diagram showing another example of the memory array structure.

Next, FIG. 3A and FIG. 3B show examples of a memory array structure employed in this embodiment. In the array structures of two examples shown in FIGS. 3A and 3B, two source lines 241 and 242 and two column select lines C1 and C2 are employed within an erase unit. In the example shown in FIG. 3A, the source line 241 is connected to the sources of the memory cells to the control gates of which row select lines R1, R4 and R5 are connected, while the source line 242 is connected to the sources of the memory cells to the control gates of which row select lines R2, R3 and R6 are connected. On the other hand, in the example shown in FIG. 3B, the source line 241 is connected to the sources of the memory cells to the control gates of which the row select lines R1, R2 and R3 are connected, while the source line 242 is connected to the sources of the memory cells to the control gates of which the row select lines R4, R5 and R6 are connected. It is to be noted that the connection between each source line and the memory cells inside the array may be either one of the array structures of FIGS. 3A and 3B.

In this second embodiment, when the erase of the memory array 210 is executed by the negative gate voltage erase, the row decoder 220 applies the supplied negative voltage 201 to the row select line group 221. At this time, the column select line group 231 is controlled so as to become floating by the column decoder 230 (or another circuit for controlling the drain voltage connected to the column decoder 230 although not specifically shown).

In this erase operation, the source control circuit 240 applies the supplied high voltage 202 to the source line 241 and the source line 242. The high voltage is applied to the source line 241 during a period different from the period in which the high voltage is applied to the source line 242, as shown in FIG. 2B.

This high voltage application timing can also be controlled by a write state machine that is built in the nonvolatile semiconductor storage device and controls the internal operation including the erase operation or directly controlled by the source control circuit 240. In the actual erase operation, a different voltage is applied for verify or the like besides the application of the erase voltage. FIG. 2B shows the erase voltage application waveforms necessary for the explanation of this invention.

A high voltage is applied to the source line 241 from the time t0 when erase starts to the time t1, and the high voltage is not applied to the source line 242. Next, during the period of the time t1 to the time t2, the high voltage is not applied to the source line 241, and the high voltage is applied to the source line 242. Although the source lines to which the high voltage is not applied are assumed to have a voltage of 0 V for the sake of explanation, this invention is not limited to this.

During the period of the time t0 to the time t1, the high voltage is supplied to the source line 241, while the source line 242 is not supplied with the high voltage but set to 0 V. At this time, the memory cells connected to the source line 242 have a source potential equal to the substrate potential, and therefore, no BTBT current is generated. Therefore, during this period, the consumption current of the high voltage 202 is determined only by the BTBT current of the memory cells connected to the source line 241.

During the next period of the time t1 to the time t2, the BTBT current of the memory cells connected to the source line 242 occupies the greater part of the consumption current of the high voltage 202 according to quite the same mechanism as described above.

During the execution of the aforementioned erase operation, the booster circuit 250 is switched so as to generate the same voltage with a smaller consumption power than in the case of the batch erase of the entire memory array 210, as described in connection with the third embodiment described later.

Therefore, the current supply capacity of the booster circuit 250 is reduced. However, since the consumption current of the high voltage 202 is reduced, the source voltage level is not lowered. Therefore, even by the erase method of this second embodiment, the memory cell erase characteristic is equivalent to that of the batch erase method.

Figure 2B:
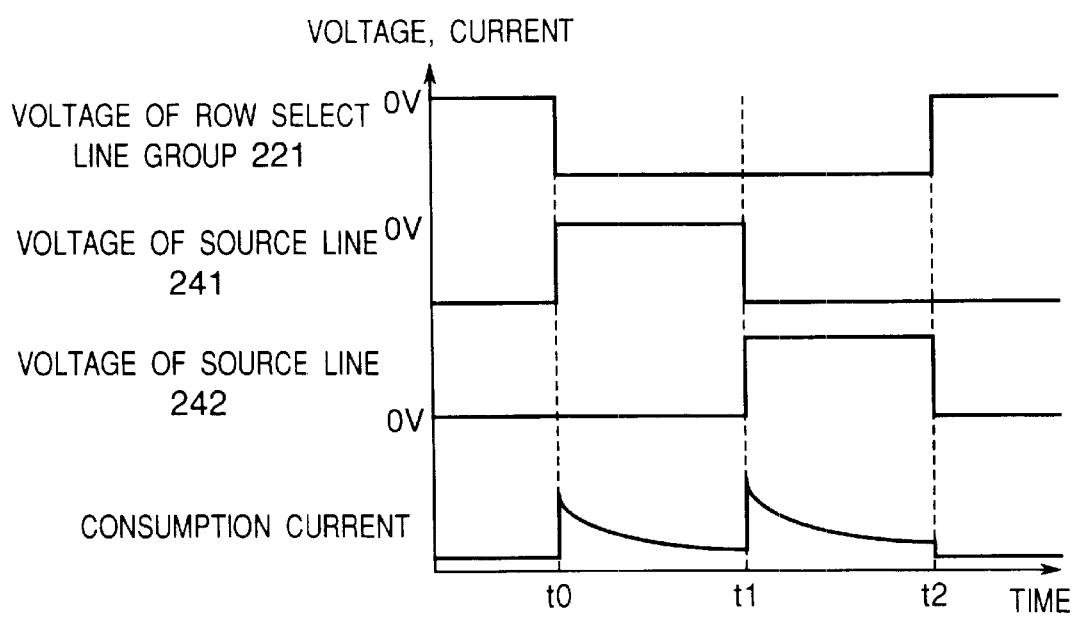
FIG. 2B is a waveform diagram showing a waveform of applied voltage and a waveform of consumption current in an erase operation.

By the method of applying the high voltage to the source lines 241 and 242 as shown in FIG. 2B, the consumption current comes to roughly have the erase current waveform of FIG. 2B. In FIG. 2B, the maximum peak current in the erase operation (i.e., the consumption current at the time t0 and the time t1) becomes about a half of the conventional consumption current peak shown in FIG. 13. Although FIG. 2B is schematic to the utmost, it is apparent that the peak of the erase current can be reduced by this embodiment.

This invention can be used quite similarly even when the method for making the control gate have a voltage of 0 V (high voltage source erase) is used without using the negative gate voltage erase for erasing the memory array 210.

According to this second embodiment, it is also possible to achieve the block batch erase similar to the conventional one by providing the source control circuit 240 with a means for simultaneously applying the high voltage to the source line 241 and the source line 242 similarly to the case where the row decoder 120 is provided with the means for applying the erase voltage to both the row select line group 121 and the row select line group 122 in the first embodiment.

(Description of Booster Circuit)

Three structural examples adopted as the booster circuits 150 and 250 of the first and second embodiments will be described next with reference to FIGS. 4A, 4B and 4C.

Figure 4A:
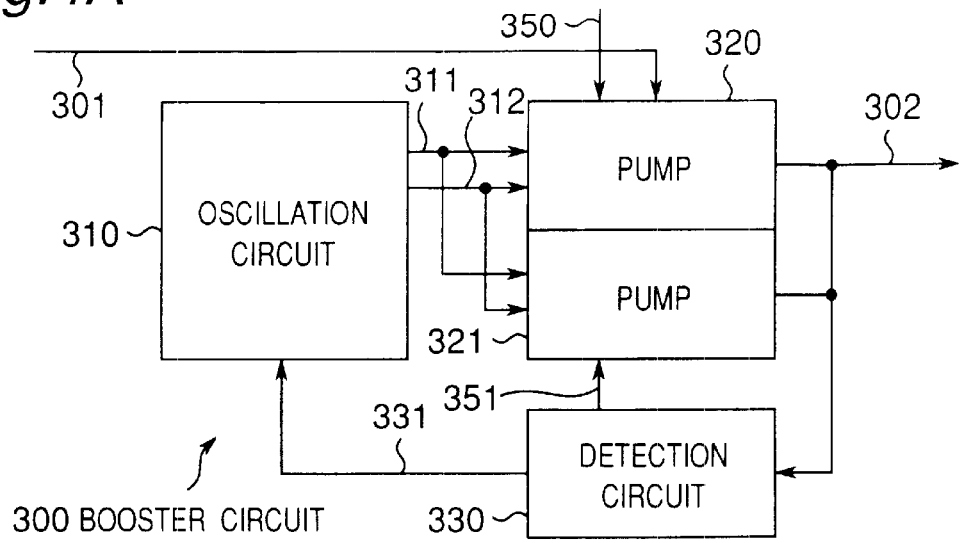
FIGS. 4A, 4B and 4C are block diagrams of booster circuits 300, 400, 500, respectively, to be used for erase operations in the first and second embodiments.
Figure 4B:
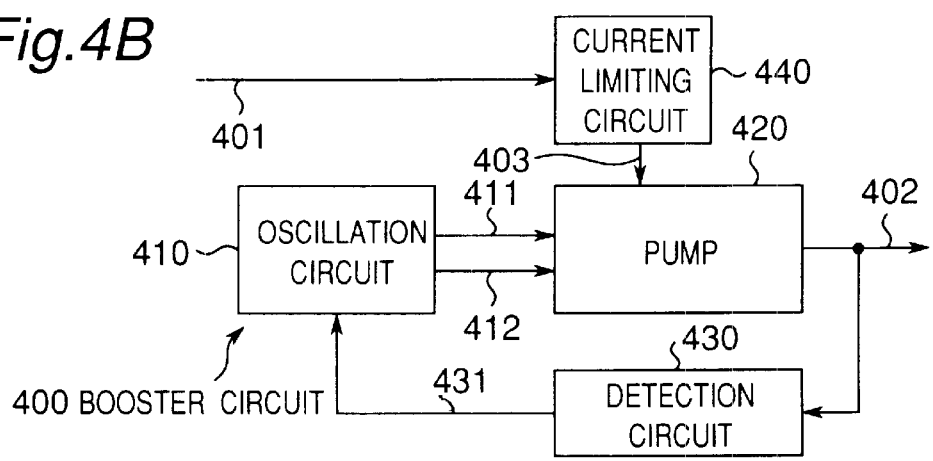
Figure 4C:
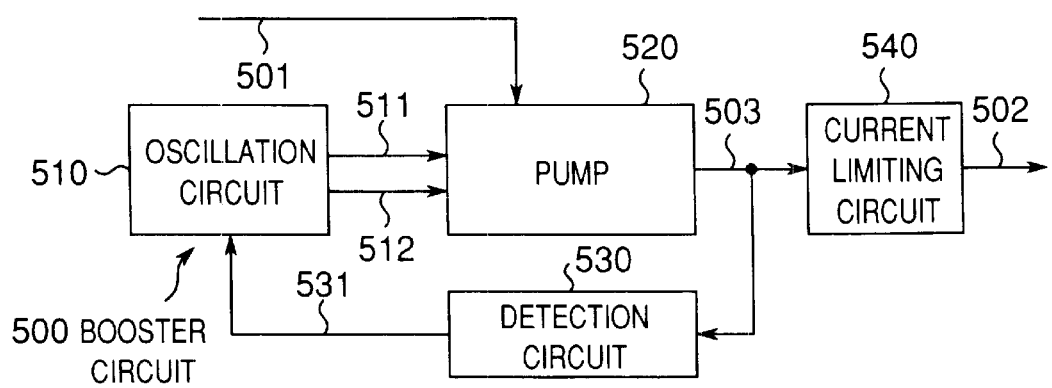

In this case, booster circuits 300, 400 and 500 of three types capable of reducing the consumption current optimum for use in this invention will herein be described as a booster circuit for generating the source voltage during erase as shown in FIGS. 4A, 4B and 4C.

The booster circuit 300 shown in FIG. 4A is one example of the booster circuit structure for generating the source voltage during erase. The operation of this booster circuit 300 for generating a high voltage 302 based on a power supply voltage 301 will be described. The oscillation circuit 310 of this booster circuit 300 generates clock signals 311 and 312 and supplies the signals to charge pump circuits 320 and 321. The charge pump circuits 320 and 321 are the charge pump circuits (PUMP) to generate the high voltage 302 from the power supply voltage 301 by being activated by enable signals 350 and 351, respectively.

Figure 11:
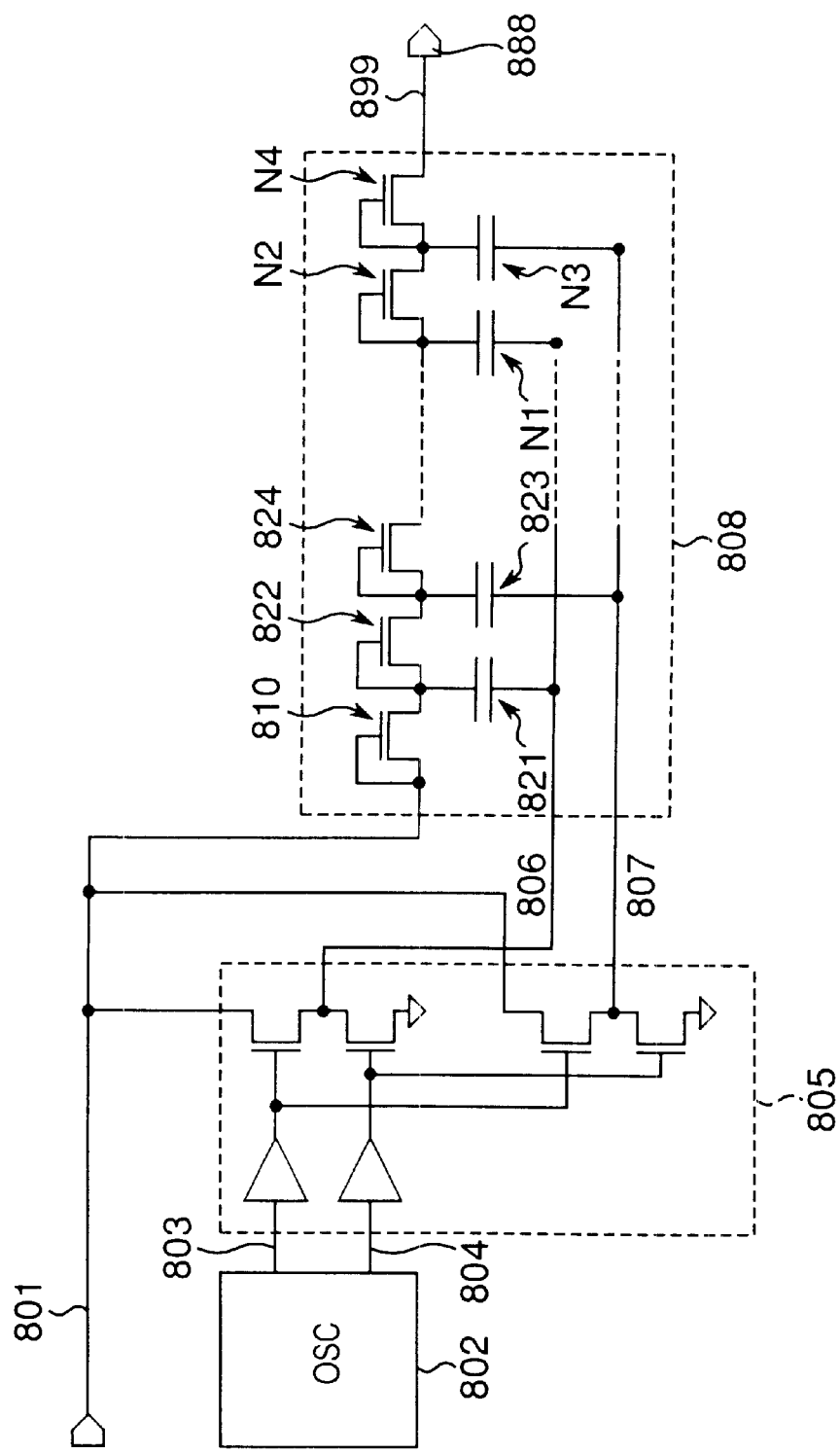
FIG. 11 is a circuit diagram of a booster circuit in a nonvolatile semiconductor storage device according to the prior art.
Figure 12:
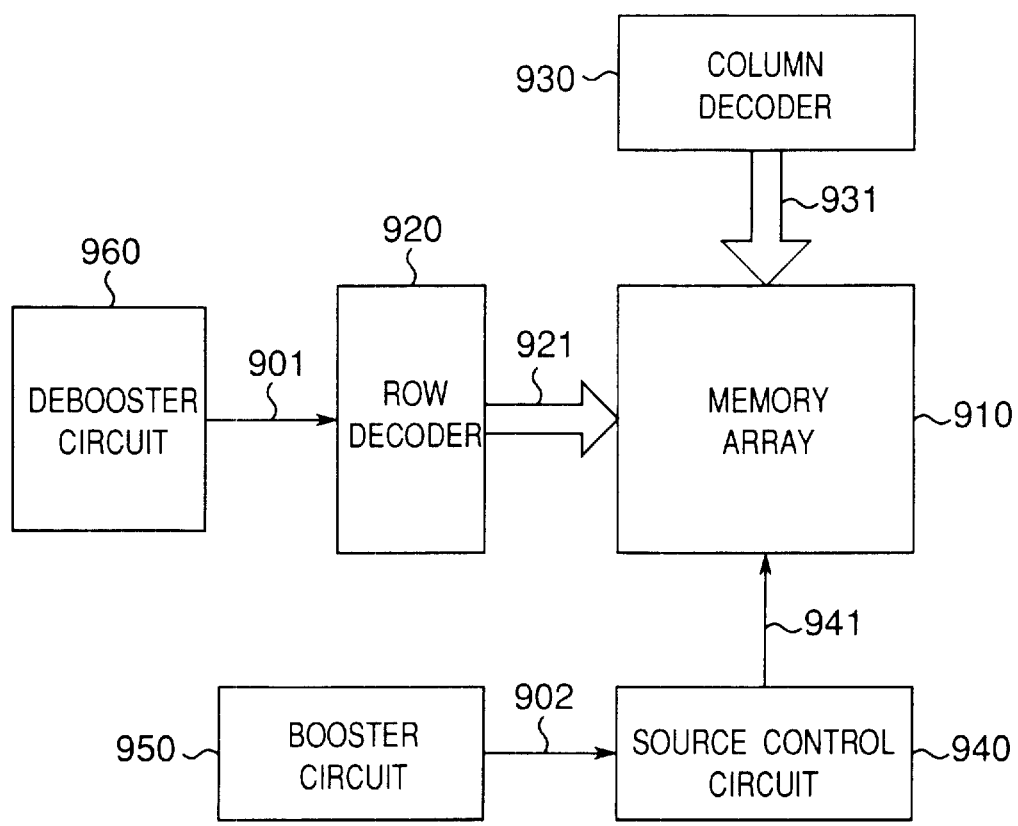
FIG. 12 is a block diagram of a nonvolatile semiconductor storage device according to the prior art.

The enable signals 350 and 351 are controlled by a write state machine similarly to the description of the aforementioned first embodiment. As the charge pump circuits 320 and 321, there can be employed, for example, the charge pump circuit 808 of FIG. 11 described in connection with the prior art technology.

A detection circuit 330 detects the voltage level of the high voltage 302 and suppresses the clock signal generation of the oscillation circuit 310 by a control signal 331 when the high voltage 302 is higher than a specified voltage. As a means for suppressing the clock signal generation, there can be employed, for example, a means for completely stopping the clock signals 311 and 312 or a means for prolonging the clock signal cycle.

If the clock signal is completely stopped, the booster circuit 300 generates a high voltage 302 during this period of stop, and the current supply capacity of the high voltage 302 is reduced when the clock signal cycle becomes long. However, if the voltage of the high voltage 302 is dropped by the current load of the high voltage 302, the detection circuit 330 recognizes the drop and releases the suppression with the clock signals 311 and 312 by the control signal 331. According to this control flow, the high voltage 302 can maintain the required voltage.

The booster circuit 300 shown in FIG. 4A can execute the switchover of operation according to an output current load in order to reduce the consumption current. That is, by inhibiting the operation of either the charge pump circuit 320 or the charge pump circuit 321 by enable signals 350 and 351 (or limiting the period of activation), the consumption current by the power supply voltage 301 is reduced. For example, when the charge pump circuit 320 and the charge pump circuit 321 consume equal currents during the operation thereof, the consumption current of the power supply voltage 301 is suppressed by about half when only one of them operates than when both of these circuits 320 and 321 operate.

By virtue of the function of reducing the consumption current as described above, the booster circuit 300, which serves as one example, can optimally be used for the source voltage generation circuit during the block erase operation of the rewritable nonvolatile semiconductor storage device of this invention.

The aforementioned booster circuit 300 is characterized in that the consumption current can be reduced by partially deactivating the booster circuit 300. FIG. 4A and the above description are the description of no more than one example and do not limit the booster circuit used for this invention.

The booster circuit 400 shown in FIG. 4B is another example of the booster circuit structure for generating the source voltage during erase. The operation of this booster circuit 400 for generating a high voltage 402 based on a power supply voltage 401 will be described. The current limiting circuit 440 of this booster circuit 400 limits the current of the power supply voltage 401 and outputs a voltage 403 to a charge pump circuit 420. An oscillation circuit 410 generates clock signals 411 and 412. The charge pump circuit 420 generates a high voltage 402 from the voltage 403. As this charge pump circuit 420, there can be employed, for example, the charge pump circuit 808 of FIG. 11 used for explaining the prior art technology, and the clock signals 411 and 412 correspond to the signals 806 and 807 in FIG. 11.

A detection circuit 430 detects the voltage level of the high voltage 402 outputted from the charge pump circuit 402. When the high voltage 402 is higher than a specified voltage, the clock signal generation of the oscillation circuit 410 is suppressed by a control signal 431. As a means for controlling this clock signal generation, there can be employed, for example, a means for completely stopping the clock signals 411 and 412 or a means for prolonging the clock signal cycle, similarly to the booster circuit 300.

This booster circuit 400 is able to operate the booster circuit 400 within a range not exceeding a specified consumption current by the operation of the current limiting circuit 440. The construction of the current limiting circuit 440 can be provided by, for example, a switch constructed of a transistor.

By virtue of the function of reducing the consumption current, the booster circuit exemplified by the booster circuit 400 can be used for the source voltage generation circuit during the block erase operation of the rewritable nonvolatile semiconductor storage device of this invention.

This booster circuit 400 is also one example of the source voltage generation circuit used for this invention. This example is characterized in that the consumption current can be reduced by limiting the current of the power supply current of the booster circuit. FIG. 4B and the above description are the description of no more than one example and do not limit the booster circuit used for this invention.

Next, the booster circuit 500 shown in FIG. 4C is one example of the booster circuit structure for generating the source voltage during erase. The operation of this booster circuit 500 for generating a high voltage 502 based on a power supply voltage 501 will be described. The oscillation circuit 510 of the booster circuit 500 generates clock signals 511 and 512. The charge pump circuit 520 generates a high voltage 503 from the power supply voltage 501. As this charge pump circuit 520, there can be employed, for example, the charge pump circuit 808 of FIG. 11 used for explaining the prior art technology, and the clock signals 511 and 512 correspond to the signals 806 and 807 in FIG. 11. A current limiting circuit 540 limits the current of the high voltage 503 and outputs a high voltage 502. On the other hand, a detection circuit 530 detects the voltage level of the high voltage 503. When the high voltage 503 is higher than a specified voltage, the clock signal generation of the oscillation circuit 510 is suppressed by a control signal 531. As a means for suppressing this clock signal generation, there can be employed, for example, a means for completely stopping the clock signals 511 and 512 or a means for prolonging the cycle, similarly to the booster circuit 300.

The booster circuit 500 outputs the high voltage 502 within a range not exceeding a specified current value by the operation of the current limiting circuit 540. By this operation, the output current load is limited, the drop of the high voltage 503 due to the load current is reduced, and the power supply ability of the booster circuit 500 is reduced. Therefore, the consumption current is limited.

By virtue of this function of reducing the consumption current, the booster circuit 500 can optimally be used for the source voltage generation circuit during the block erase operation of the rewritable nonvolatile semiconductor storage device of this invention. This booster circuit 500 is one example of the source voltage generation circuit, and the consumption current can be reduced by limiting the output current of the booster circuit. It is to be noted that FIG. 4C and the above description are the description of no more than one example of the booster circuit employed in the present invention and are not limited to the aforementioned construction.

(Third Embodiment)

Next, a third embodiment, which is a storage contents erase method for a nonvolatile semiconductor storage device according to the invention, is described with reference to the flowchart shown in FIG. 5.

This third embodiment relates to an overerase decision method with the use of the nonvolatile semiconductor storage device of the first or second embodiment.

Figure 5:
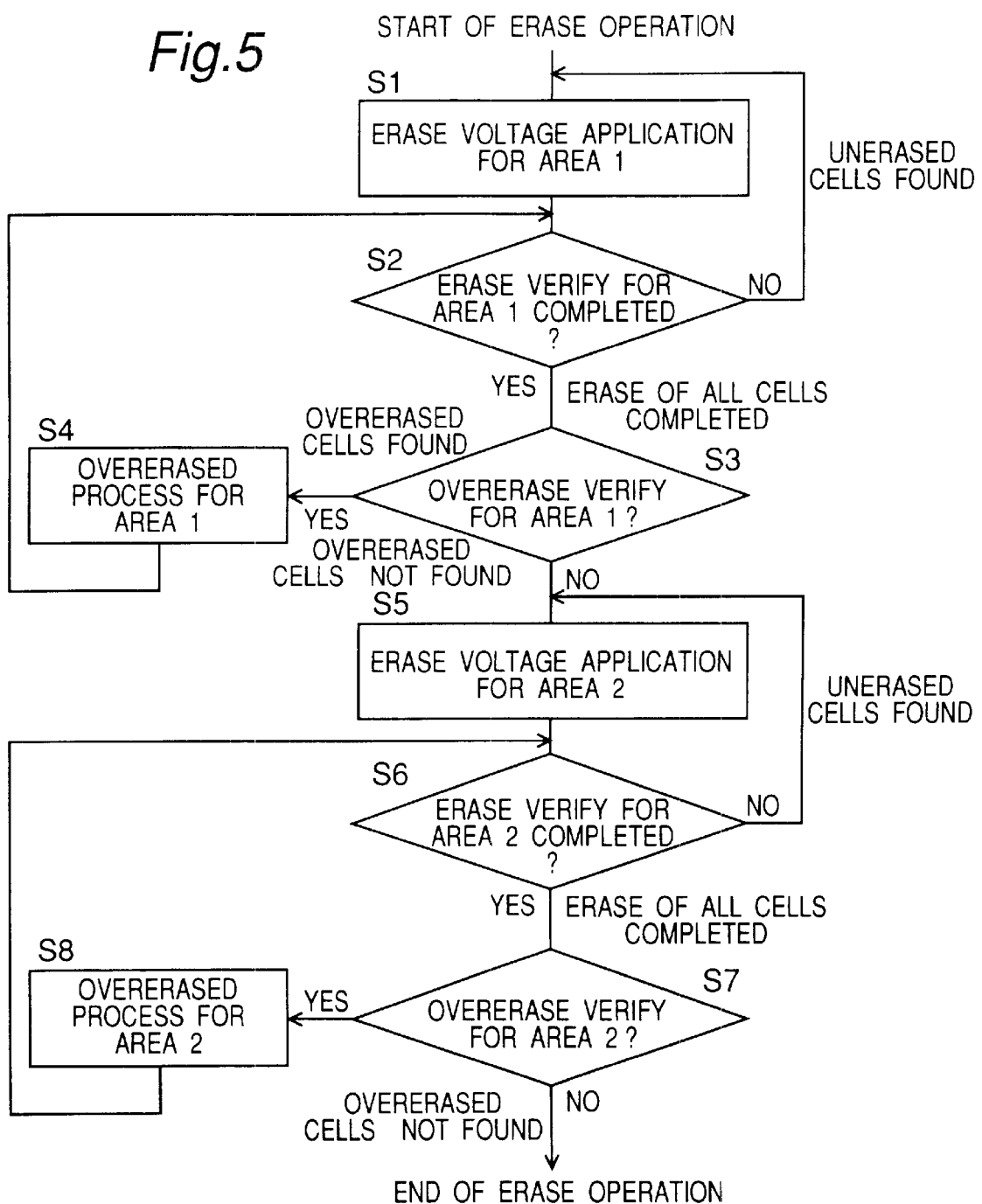
FIG. 5 is a flowchart for explaining a storage contents erase method, which is a third embodiment of the invention.

As shown in the flowchart of FIG. 5, in an erase operation of a flash memory, normally, after an erase voltage is applied (S1, S5), an erase verify (S2, S6) for verifying that the threshold value (threshold voltage) has lowered enough as well as an overerase verify (S3, S7) for verifying that the threshold value has not lowered too much are executed.

If it is found by this erase verify (S2, S6) that threshold values of memory cells (area 1, area 2) have not lowered enough, a further erase voltage is applied (S1, S5). Also, if it is found by the overerase verify (S3, S7) that the threshold values have lowered too much, the threshold values are raised by writing into memory cells in the area 1 and the area 2 that could be in an overerased state (S4, S8).

The storage contents erase method of the third embodiment is constituted by incorporating the above-described verify operations into the erase operations described in the first and second embodiments. Although the erase operation includes a process of generally equalizing the threshold values of the memory cells prior to erase, or a process of changing over the voltage to be used, or other processes in addition to the application of an erase voltage and the verify operation, yet FIG. 5 describes only operations necessary for the explanation of the order of the verify operation.

In an erase of memory cells of an EEPROM, overerase largely matters. The term "overerase" refers to a phenomenon that during the execution of an erase, excessively letting out electrons accumulated in the floating gate causes the threshold values of memory cells to go around 0 V or under, i.e., a negative voltage, so that the control gate permits a current to flow between drain and source even in a 0 V state. In the case that one memory cell has come to an overerased state, a current is passed therethrough upon execution of a read even if the row select line of the overerased cell is 0 V (i.e., the memory cell connected to the row select line is nonselected), so that the memory cell could not be read normally even if other memory cells connected to the same column select line are in a write state. Also, if memory cells which are not in a completely overerased state but in a nearly overerased, low threshold-value state are connected on the same column select lines, the memory cells connected to the same column select line could no longer be read normally, as in the foregoing case.

In a split-gate type EEPROM memory cell, a channel is never formed between drain and source unless the select gate is turned ON. Therefore, it becomes possible to prevent misoperations due to overerase, but the cell occupies larger area and, besides, larger process changes are involved.

Figure 9A:
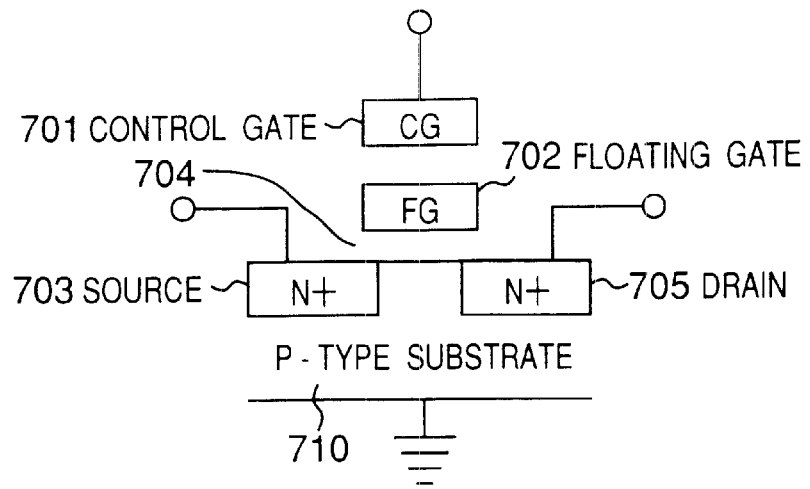
FIG. 9A is a view showing a typical memory cell structure of an EEPROM.
Figure 9B:
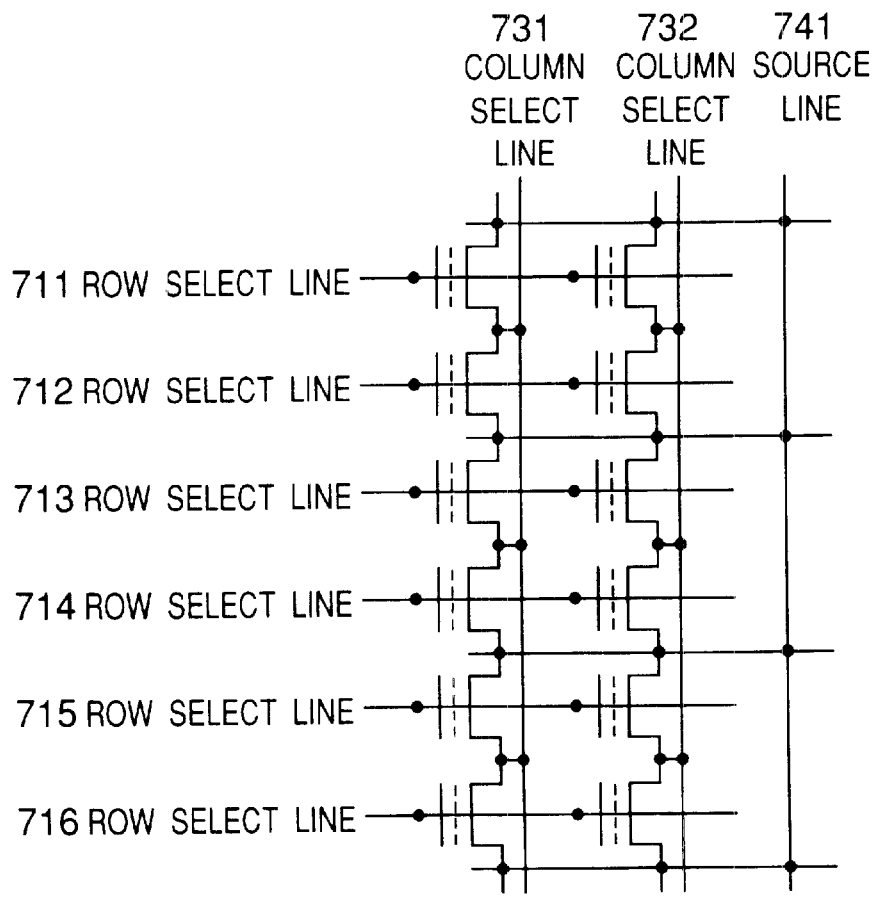
FIG. 9B is a view showing an array structure of a flash memory.

With a one-transistor type EEPROM memory cell shown in FIGS. 9A and 9B, it is widely practiced to check all the memory cells for their threshold values not having lowered under a predetermined threshold value after the execution of an erase, where if the threshold values have lowered under the predetermined one, a milder write operation is done to thereby increase the threshold values. The operation of checking that the threshold value of a memory cell is not lower than a predetermined threshold value is widely called overerase verify.

In the case where this storage contents erase method of the third embodiment is simply applied to the foregoing first and second embodiments, erase voltage application, erase verify and overerase verify are carried out in the sequence shown in FIG. 5. In particular, in the application to the example shown in the first embodiment, the area 1 in steps S1 to S4 of FIG. 5 refers to a set of memory cells connected to the row select line group 121 in FIG. 1A, and the area 2 in steps S5 to S8 refers to a set of memory cells connected to the row select line group 122.

Also, in the case where this third embodiment is applied to the second embodiment, the area 1 in steps S1 to S4 in FIG. 5 refers to a set of memory cells connected to the source line 241, and the area 2 in steps S5 to S8 refers to a set of memory cells connected to the source line 242.

Here is explained a case where the erase operation shown in the first embodiment is executed by the flowchart shown in FIG. 5.

First, an erase voltage is applied to memory cells included in the area 1 (step S1). The erase voltage application (step S1) is iterated until all the memory cells included in the area 1 are erased, while executing a subsequent erase verify (step S2).

After all the memory cells included in the area 1 are erased with the steps S1 and S2, it is checked whether or not each memory cell is in an overerased state by a subsequent overerase verify (step S3). If it is decided at the step S3 that some memory cells are in the overerased state, the program goes to step S4, where an overerase process (i.e., write operation) is executed on the memory cells that could be in the overerased state. Because the overerase process at this step S4 might cause an excessive rise in threshold value, the program returns to the erase verify of step S2. Over these steps, the erase operation for the area 1 is completed.

Next, the program going to step S5, an erase operation similar to that of steps S1 to S4 described above is executed also for the area 2. Thus, by both the area 1 and the area 2 being erased, all the memory cells that are included in the memory array 110, which is an erase unit, are erased and, still, do not go toward an overerased state.

In the case where an erase is done according to the sequence of the flowchart of FIG. 5, before the erase voltage is applied to the area 2, erase voltage application, erase verify and overerase verify are executed so that all the memory cells included in the area 1 fall within a specified range of threshold values. That is, in this flow of processing, the erase of the memory cells included in the area 2 is executed after the overerase verify on the memory cells included in the area 1 is executed.

However, for example, common source lines are connected to the memory cells of area 1 and area 2 in the first embodiment, and common row select lines are connected to the memory cells of area 1 and area 2 in the second embodiment. Therefore, after the completion of the erase verify and the overerase verify, the memory cells included in the area 1 have the erase voltage applied to either the source lines or the word lines, thus undergoing erase disturb, so that their threshold values might be even lower than the level of overerase verify. When the erase disturb has deeper influence, this issue can be solved by using a fourth embodiment as described below.

(Fourth Embodiment)

Figure 6:
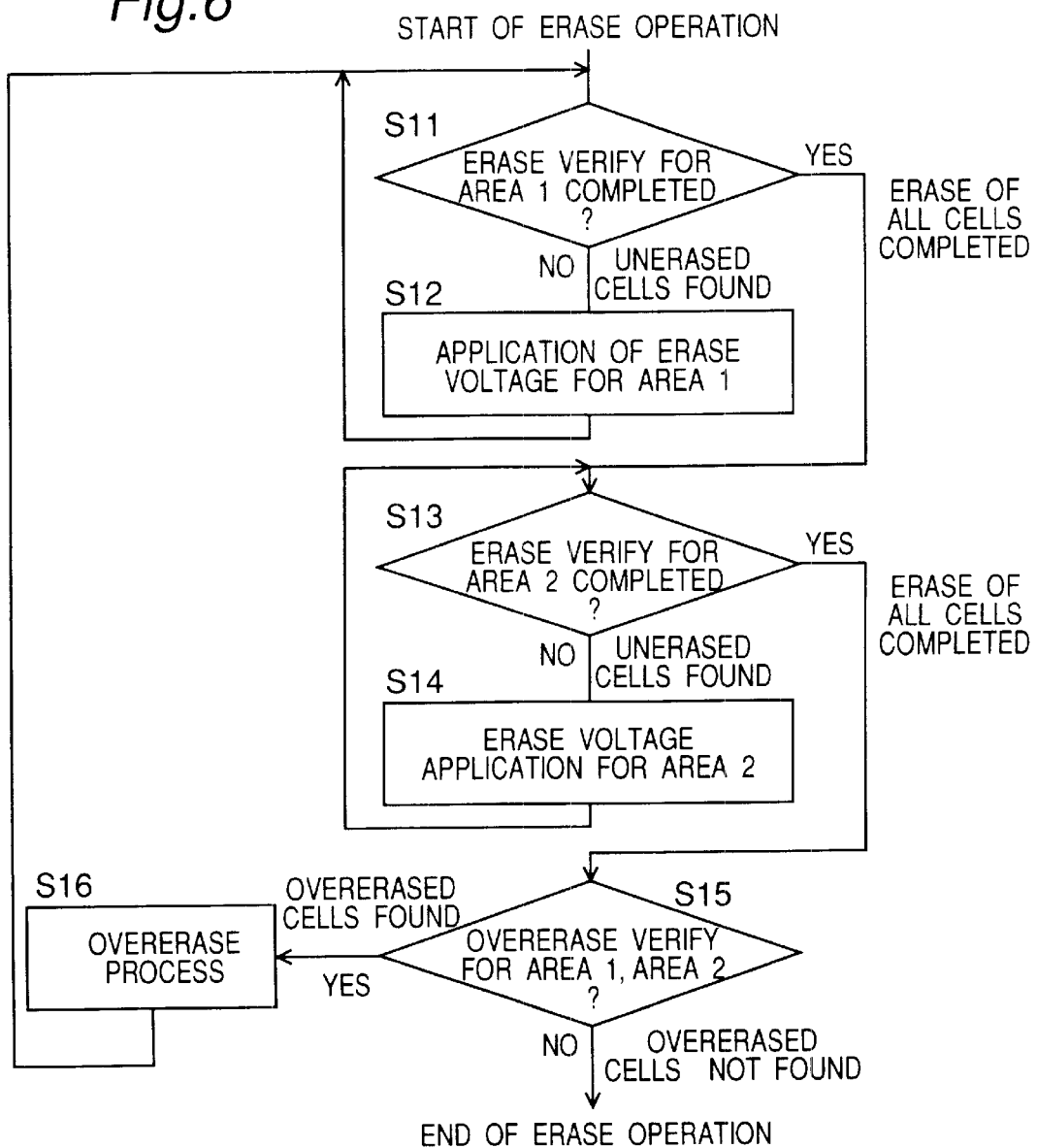
FIG. 6 is a flowchart for explaining a storage contents erase method, which is a fourth embodiment of the invention.

Next, FIG. 6 gives a flow of processing by a fourth embodiment that solves the above drawbacks. This fourth embodiment is explained on a case where the erase operation in the first embodiment is executed by the flow of FIG. 6.

In this embodiment, threshold values of memory cells included in area 1 are checked by erase verify at step S11. If some unerased memory cells are found, the program goes to step S12, where the erase voltage is applied to the area 1 and the program returns to step S11.

These steps S11 and S12 are iterated until all the memory cells of the area 1 are erased. If all the memory cells of the area 1 are erased, the program goes to step S13, being branched to the processing for area 2.

Also for the area 2, as in the case of the area 1, threshold values of the memory cells are checked at step S13 by the erase verify. If some unerased memory cells are found, the program goes to step S14 and the erase voltage is applied to the area 2, the program returning to step S13. A loop of these steps S13 and S14 is iterated until all the memory cells of the area 2 are erased.

Thereafter, if it is decided at step S13 that all the memory cells of the area 2 have been erased, the program goes to step S15, where overerase verify is executed on the memory cells of the area 1 and the area 2. If it is decided that there are overerased cells, the program goes to step S16, where an overerase process (i.e., write operation) is executed on memory cells that could be in the overerased state out of the memory cells of the area 1 and the area 2. Thereafter, the program returns to step S11.

According to this fourth embodiment, after all the memory cells targeted for erase are erased, the program goes to step S15 and an overerase verify is executed. Then, if overerased memory cells are not found, the memory cells will never undergo any erase disturb after this. Therefore, after the sequence of erase operation, it can be ensured that the memory cells keep within the reference threshold value checked in the overerase verify. Consequently, verify precision of the same level as in the conventional (batch) erase method can be obtained.

Needless to say, the processing flow in this fourth embodiment can be applied without any changes also to cases where the erase operation is executed with the erase block divided into three or more areas. In this case, the overerase verify is executed collectively after the completion of the erase voltage application and the erase verify.

(Fifth Embodiment)

Next, a fifth embodiment of the invention is described with reference to FIG. 7.

By the foregoing first and second embodiments, indeed it becomes possible to reduce the consumption current peak at erases, but the erase time inevitably increases. That is, when the first embodiment and the second embodiment are applied without any changes, erase time generally proportional to the number of divisions of the memory array block is required. For example, when the memory array block is divided into two areas as illustrated in the first embodiment, the erase time required for erase voltage application becomes about double. Hence, this fifth embodiment is intended to alleviate the increase in erase time.

This fifth embodiment is explained here on a case where the block is divided into four areas. However, the embodiment of this invention is not limited to this, and permits the block to be divided into arbitrary numbers, ranging from two areas at a minimum to a number of areas corresponding to the product of the number of row select lines and the number of divisional source lines at a maximum.

Figure 7:
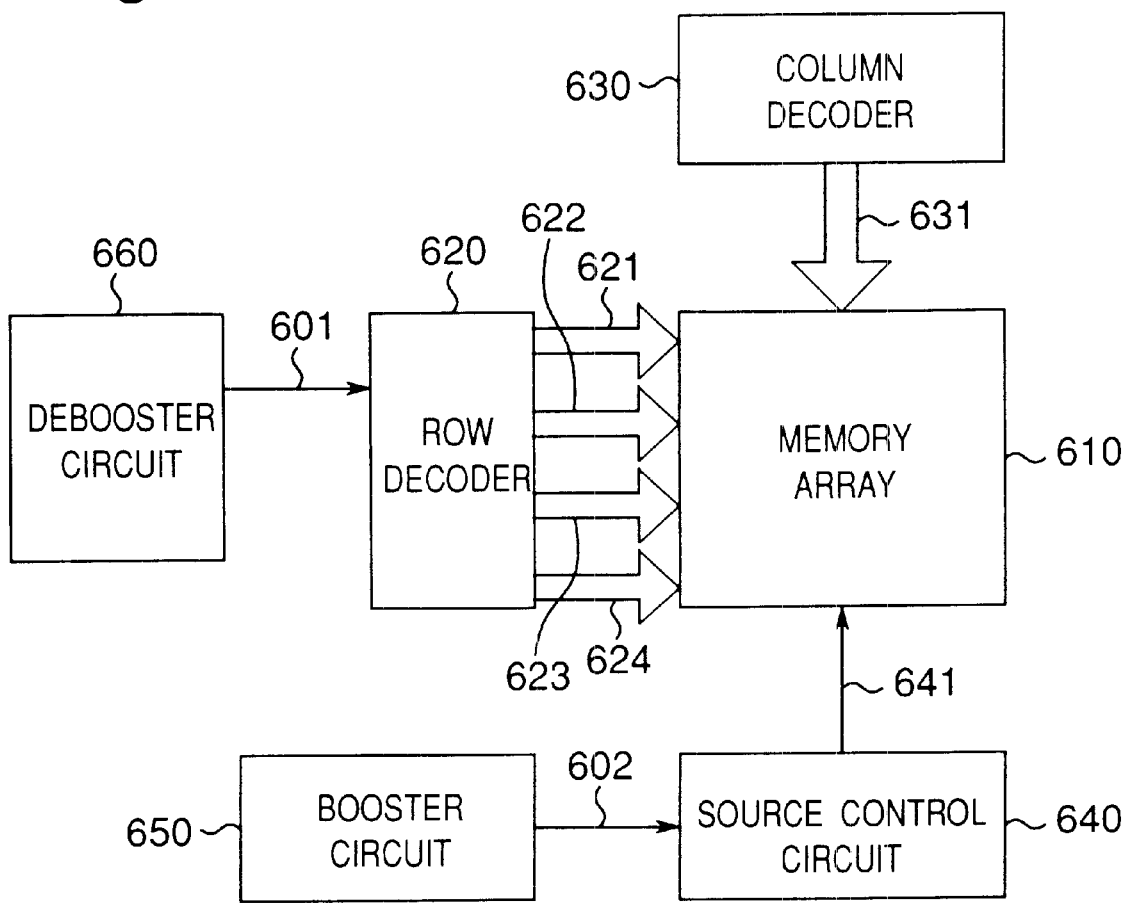
FIG. 7 is a block diagram of a nonvolatile semiconductor storage device in a fifth embodiment of the invention.

In this fifth embodiment, as shown in FIG. 7, the row select lines are divided into four groups (621, 622, 623, 624) for execution of the erase operation according to the invention. Desirably, this number of divided areas is determined by taking into consideration a targeted consumption current peak and a consumption current peak at a block batch erase, which is exemplified by a division into four areas in the case where the consumption current peak due to the BTBT current needs to be suppressed to one quarter that of block batch erase.

FIG. 7 illustrates only part of the block-erasable nonvolatile semiconductor storage device necessary for the explanation of the fifth embodiment of the invention. This fifth embodiment has a structure quite similar to the structure used in the explanation of the first embodiment and shown in FIG. 1A. Therefore, the description is made only on the differences from the first embodiment shown in FIG. 1A.

The first embodiment has been described on a case where row select lines connecting to the erase-target block are divided into two row select line groups 121, 122. By contrast, this fifth embodiment is described on a case where they are divided into four row select line groups 621, 622, 623, 624. Therefore, in FIG. 7, the row select lines are divided into the four groups of a row select line group 621, a row select line group 622, a row select line group 623 and a row select line group 624. The rest of constitution is the same as in the FIG. 1A except differences in reference numeral. That is, a debooster circuit 660, a row decoder 620, a column decoder 630, a memory array 610, a booster circuit 650 and a source control circuit 640 in FIG. 7 are of the same constitution as the debooster circuit 160, the row decoder 120, the column decoder 130, the memory array 110, the booster circuit 150 and the source control circuit 140 in FIG. 1A. It is noted that reference numeral 631 denotes a column select line group, 641 denotes a source line, 601 denotes a negative voltage, and 602 denotes a high voltage.

In this nonvolatile semiconductor storage device whose structure for erase is shown in FIG. 7, since the erase block is divided into four areas, the erase method described in the foregoing embodiment would take about a quadruple of erase time for the erase voltage application, compare with the non-divisional case. In this fifth embodiment, increase in required time is reduced by applying the erase voltage to a plurality of areas simultaneously.

Figure 8:
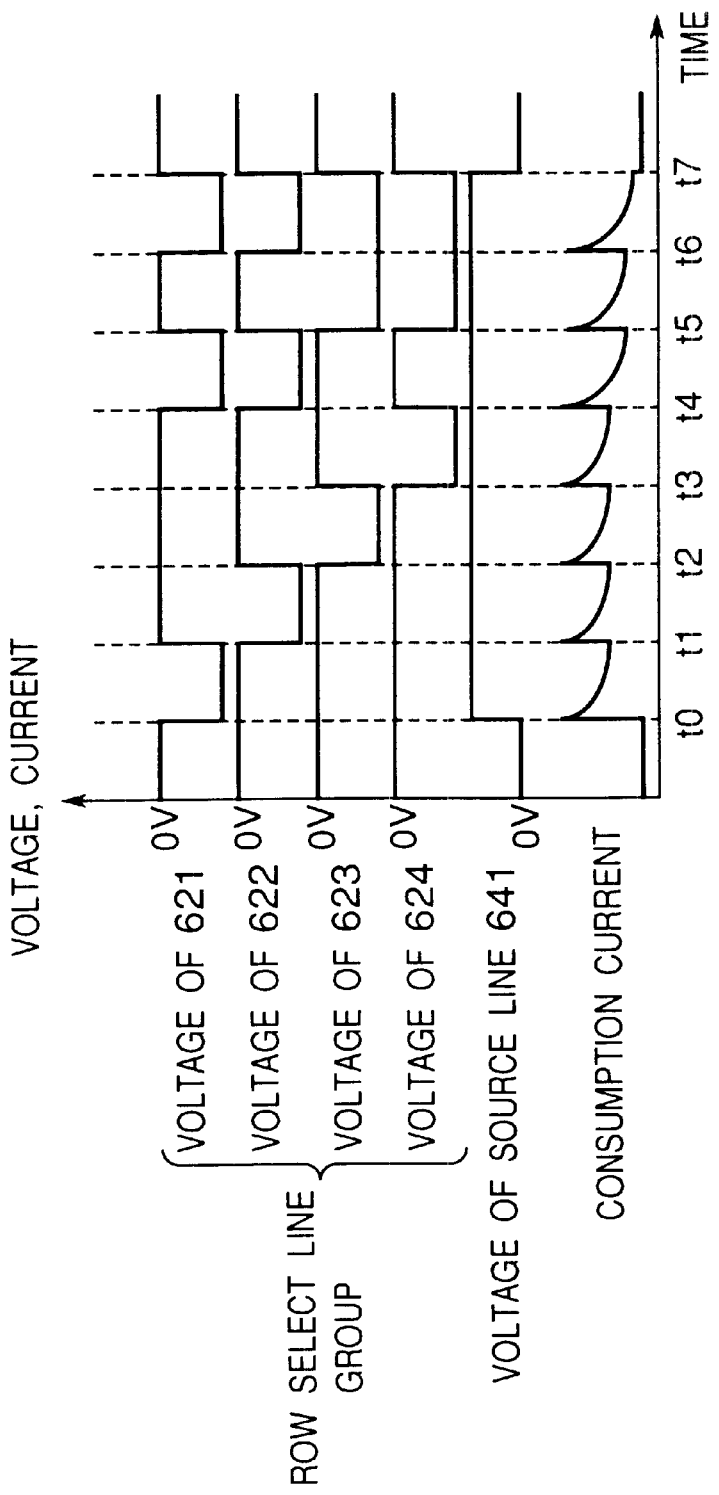
FIG. 8 is a voltage and current waveform diagram representing an erase operation in the fifth embodiment.

The method of erase voltage application by this fifth embodiment is explained with reference to FIG. 8. FIG. 8 is a waveform diagram showing the method of erase voltage application in an erase operation in the fifth embodiment.

As shown in FIG. 8, during a period from time t0 to time t4, erase voltage is applied to the individual row select line groups 621–624, separately. The erase voltage application time to the individual areas corresponding to the row select line groups 621–624 is set to not less than a time duration that causes the erase current of the high voltage 602 due to the BTBT current to become a half or less.

During a period from time t4 to time t6, erase voltage is applied simultaneously to two areas, where the maximum value of consumption current due to the high voltage 602 is not more than the maximum value during the period from time t0 to time t4.

As the time duration from time t4 to time t5, and as the time duration from time t5 to time t6, not less than a time duration that causes the consumption current due to the high voltage 602 to be halved is ensured. Also, during a period from time t6 to time t7, erase voltage is applied simultaneously to the four row select line groups 621–624. The peak current during this period from time t6 to time t7 can be suppressed to not more than the peak current value of the period from time t4 to time t6.

When erase voltage is applied completely separately to the individual areas corresponding to the row select line groups 621–624 (when there are no overlaps of applied voltage waveforms on the time base), a time duration obtained by totaling the time from time t0 to time t4, a double of the time from time t4 to time t6, and a quadruple of the time from time t6 to time t7 is required as the erase voltage application time.

Therefore, according to this fifth embodiment, the consumption current peak is suppressed during the first period (t0–t4) in which the applied voltage waveforms corresponding to the individual areas do not overlap with one another. Then, during the subsequent periods of t4–t6 and t6–t7, waveform overlaps are gradually multiplied so that increases in the required time for erase operation can be reduced to a large extent while the consumption current peak is suppressed.

In the erase voltage application method shown in FIG. 8, target areas for erase voltage application are switched over when the consumption current due to the high voltage 602 has lowered to a half or less. The timing for this switching may be decided by a method of switching at regular time intervals, a method of switching by checking the threshold values of the memory cells, or a method of switching by detecting the consumption current, and the like.

In the case where the method of switching at regular time intervals is adopted, the timing of switching may be determined by fully considering variations in erase characteristics among devices or their dependence on the environment or the like. Also, in the case of the method of switching by checking the threshold values of the memory cells, it is also possible to check the threshold values of all the memory cells, or to reduce the time required for the detection of any changes in threshold value by sampling several memory cells and checking their threshold values. Also, in the case of the method of switching by detecting the erase current, indeed there arises a need for a detection circuit, but this allows the current value to be grasped most directly, thus making it easier to determine an appropriate timing of switching. In either case of these, too early a timing of switching could make it impossible to sufficiently reduce the erase current peak, and too late a timing could cause the required erase time to increase.

According to this fifth embodiment, when the erase-current peak value is reduced by executing the block erase, which is shown in the first embodiment or the second embodiment, with the block divided into a plurality of areas, the degree of increase in the required erase time can be alleviated. Although this fifth embodiment has been described on a case where row select lines connected to the erase block are divided into four row select line groups, it is also possible, for example, that the erase block is divided into four areas by dividing the source lines into four groups with the row select lines given in one group, or that the erase block is divided into four areas by dividing the source lines into two groups with the row select lines divided in two groups. In these cases also, the block erase can be completed by seven times of erase voltage application, as in the case shown in FIG. 8.

(Sixth Embodiment)

Next, a storage contents erase method for a nonvolatile semiconductor storage device as a sixth embodiment of the invention is described with reference to FIGS. 14 and 17.

Figure 14:
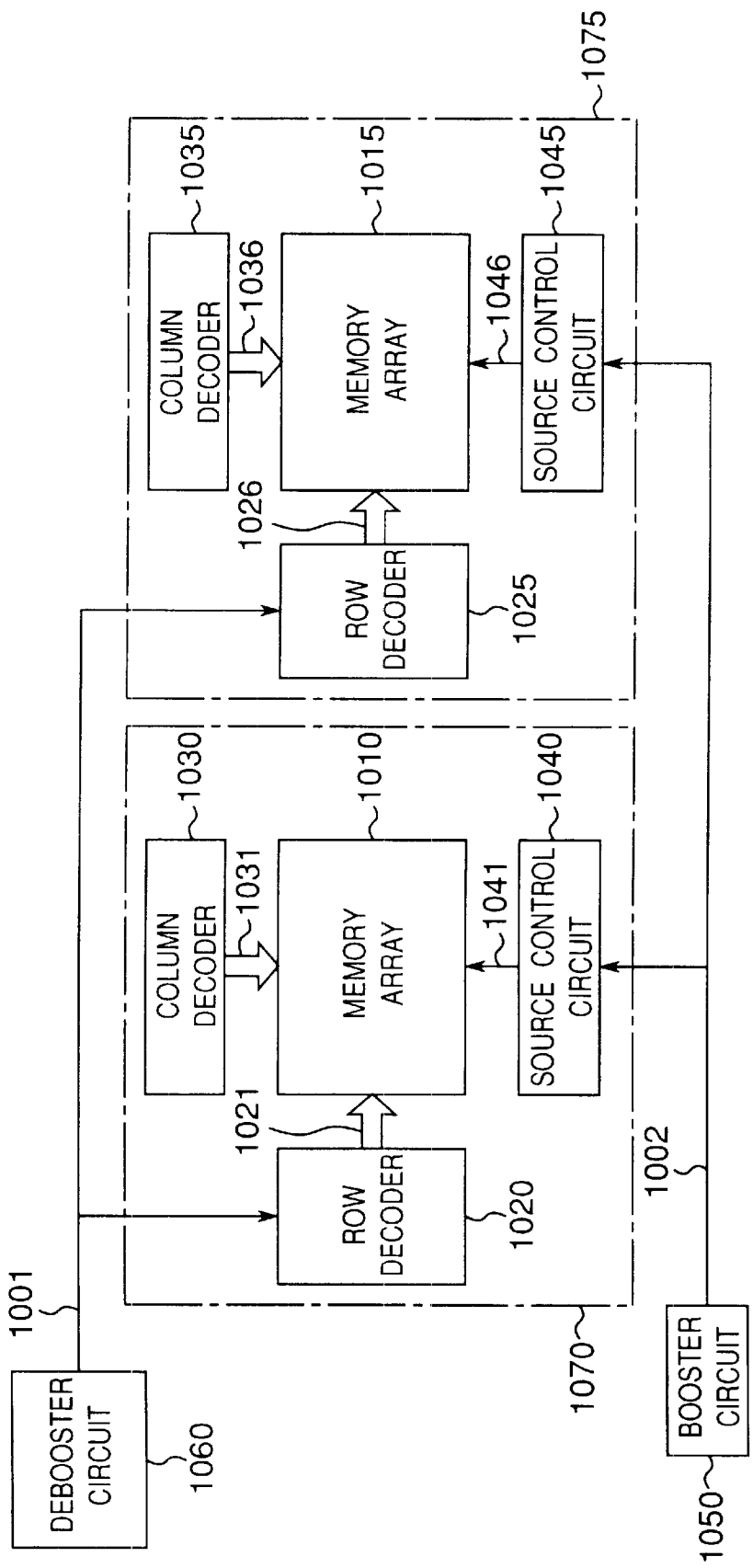
FIG. 14 is a block diagram for explaining an erase method for a plurality of blocks.

The erase method of this sixth embodiment is explained on a method in which both a memory array 1010 of a block 1070 and a memory array 1015 of a block 1075 shown in FIG. 14 are erased.

Figure 17:
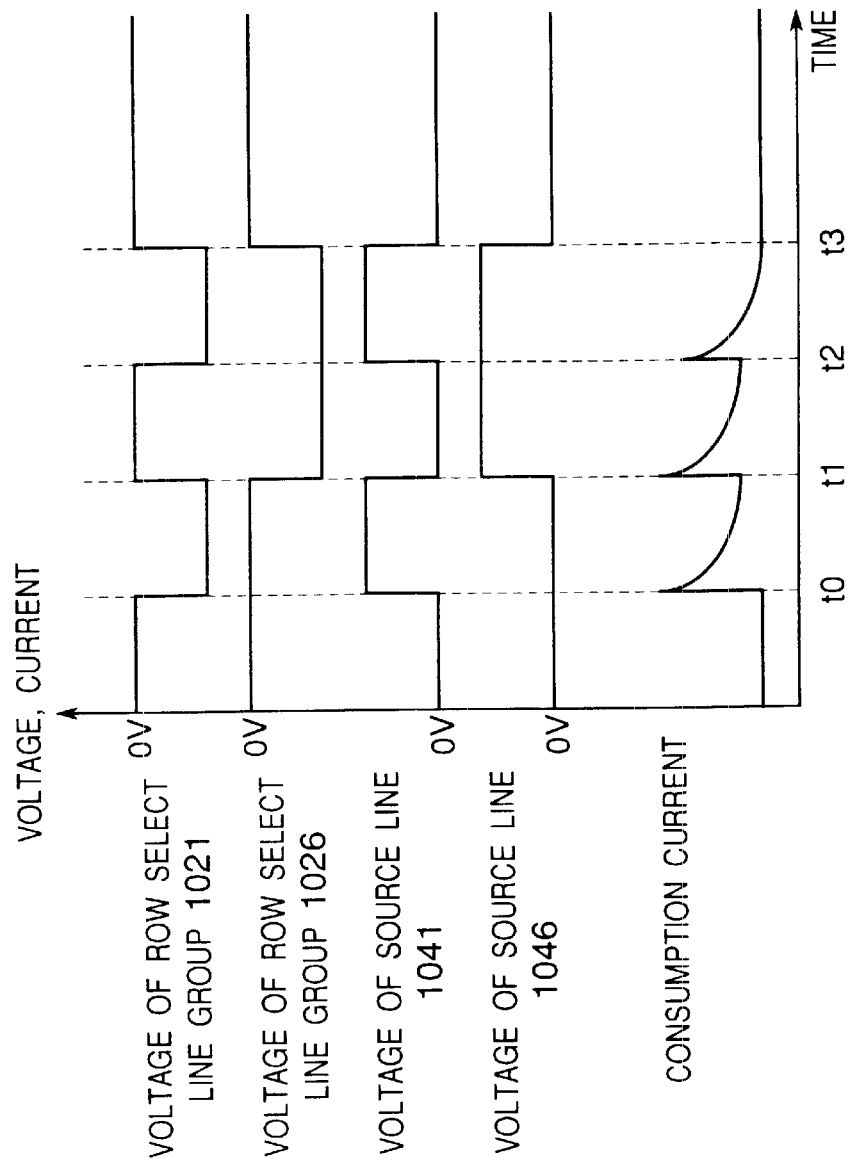
FIG. 17 is a voltage and current waveform diagram representing an erase operation in an erase method as a sixth embodiment of the invention.

Referring to FIG. 17, a method of applying the erase voltage to the memory arrays 1010, 1015 in the erase method of this embodiment is explained. The erase voltage is applied to the memory array 1010 during a period from time t0 to time t1, while no erase voltage is applied to the memory array 1015.

That is, during the period from time t0 to time t1, a negative voltage 1001 generated by a debooster circuit 1060 is applied via a row decoder 1020 to a row select line group 1021, where the voltage of this row select line group 1021 becomes a specified negative voltage. Also, a positive voltage 1002 generated by a booster circuit 1050 is applied via a source control circuit 1040 to a source line 1041, where the voltage of this source line 1041 becomes a specified positive voltage. In this case, on the other hand, at the block 1075, the voltages from the debooster circuit 1060 and the booster circuit 1050 are not applied to a row select line 1026 and a source line 1046 by a row decoder 1025 and a source control circuit 1045.

Next, during the period from time t1 to time t2, converse to the period from time t0 to time t1, the erase voltage is not applied to the memory array 1010 while the erase voltage is applied to the memory array 1015.

That is, during the period from time t1 to time t2, as shown in FIG. 17, the voltage of the row select line group 1021 and the source line 1041 of the block 1070 is 0 V, while the row select line group 1026 becomes a negative voltage and the source line 1046 becomes a positive voltage in the block 1075.

Next, during the period from time t2 to time t3, the erase voltage is applied to both memory arrays 1010 and 1015. That is, as shown in FIG. 17, in both blocks 1070 and 1075, the row select line groups 1021 and 1041 become a negative voltage and the source lines 1041 and 1046 become a positive voltage.

As described above, during the period from time t2 to time t3 shown in FIG. 17, since the erase voltage is applied to both of the two memory arrays 1010 and 1015, the number of memory cells that consume the BTBT current increase, as compare with that before the time t2.

However, the memory cells included in the memory array 1010 have been progressed in erase operation to some extent over the period from time t0 to time t1, and the memory cells included in the memory array 1015 have been progressed in erase operation to some extent over the period from time t1 to time t2. Therefore, during the period from time t2 to time t3, the BTBT current has been decreased, as compared with that at the start of the erase operation. Consequently, by ensuring sufficient periods as the period from time t0 to time t1 and the period from time t1 to time t2, respectively, current consumption of the high voltage 1002 during periods following the time t2 can be suppressed sufficiently.

According to this embodiment, the sum of the time duration from time t0 to time t1 and the time duration from time t1 to time t2 can be suppressed to a level generally similar to the erase time of one block with the conventional erase method. Likewise, the sum of the time duration from time t1 to time t2 and the time duration from time t2 to time t3 can be suppressed to a level generally similar to the erase time of one block with the conventional erase method.

Figure 15:
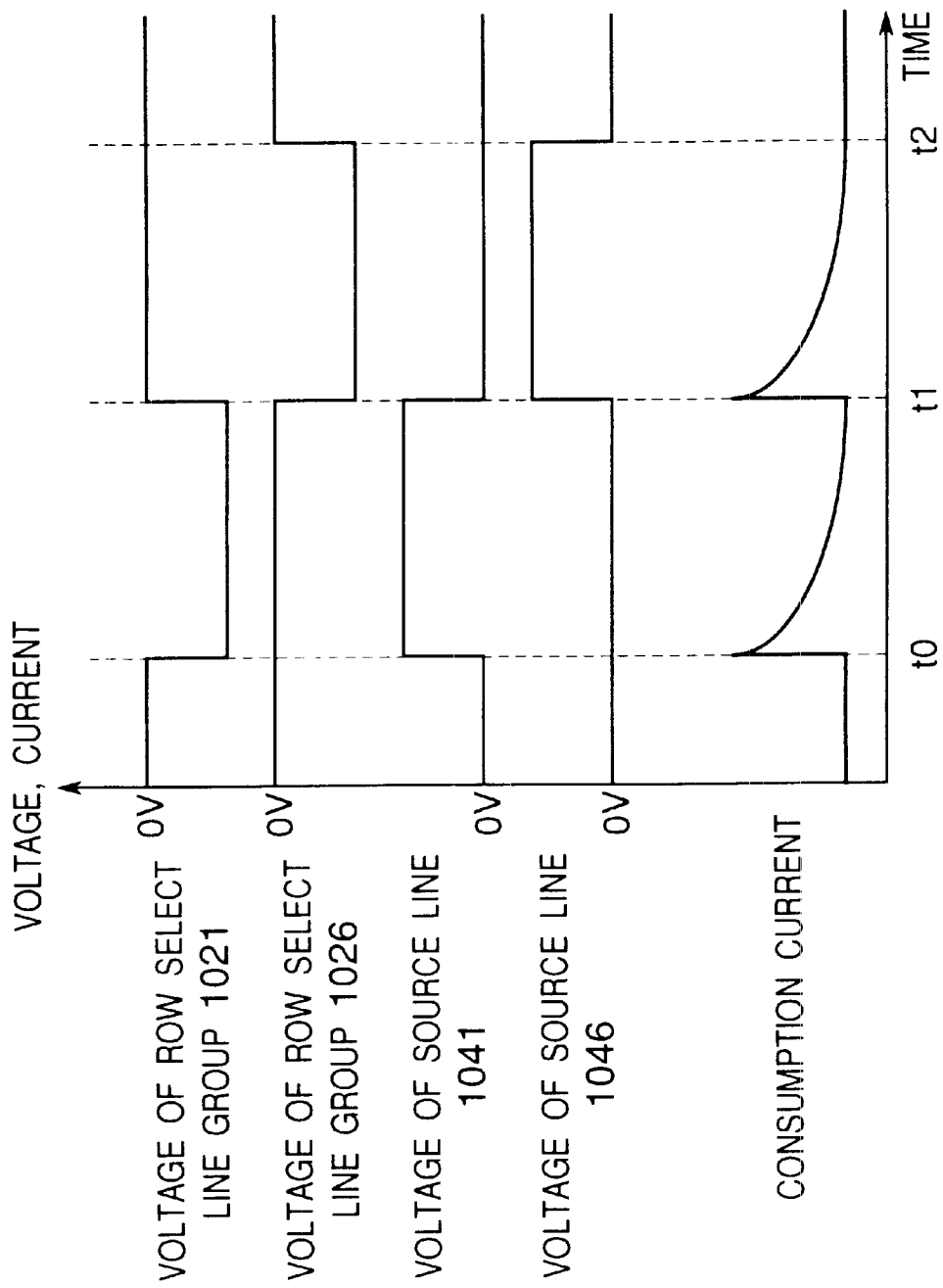
FIG. 15 is a voltage and current waveform diagram representing an erase operation according to the prior art.
Figure 16:
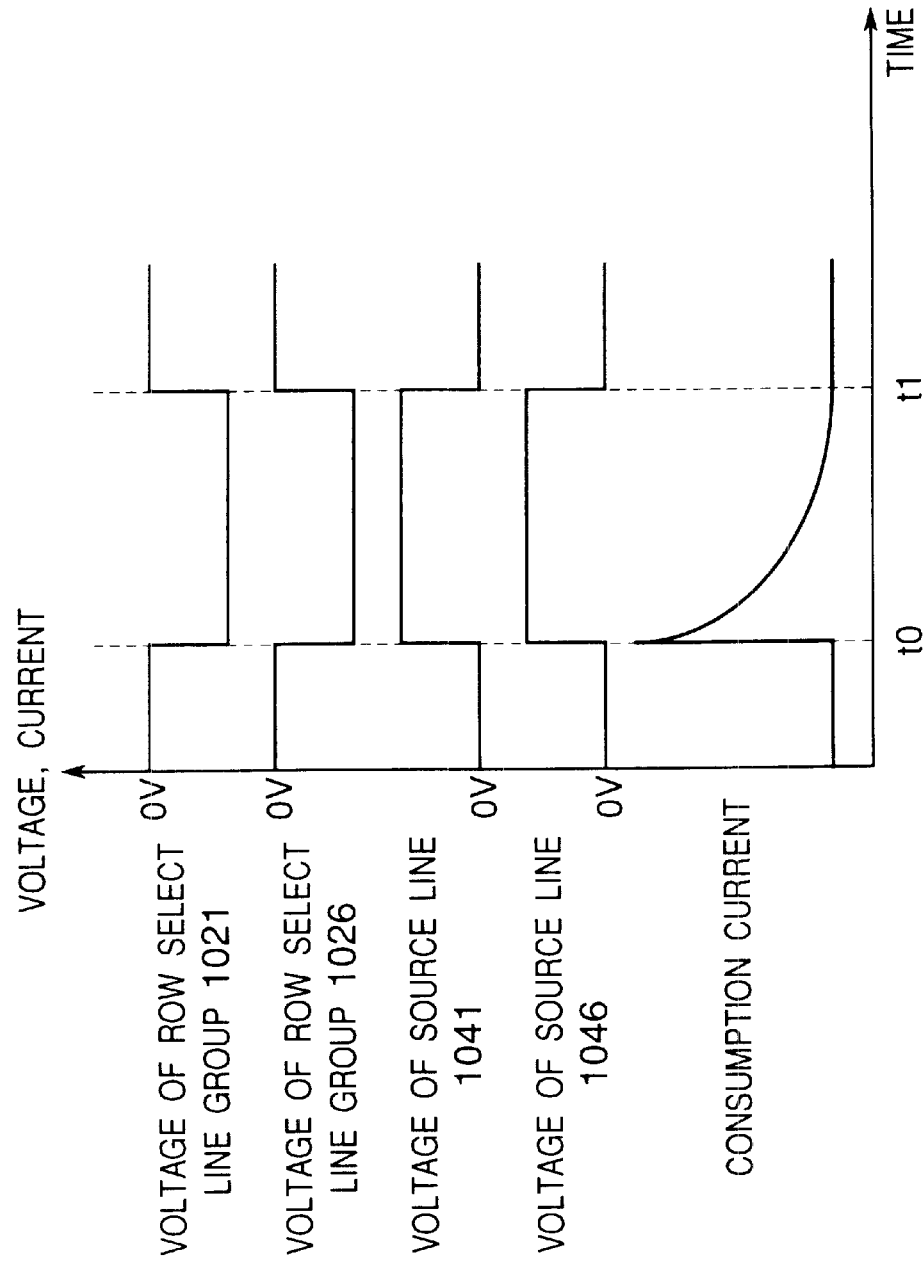
FIG. 16 is a voltage and current waveform diagram representing an erase operation according to the prior art.

Therefore, the time duration from time t0 to time t2 can be suppressed to a shorter one, as compared with the time duration from time t0 to time t2 in FIG. 15 during which the erase voltage is applied to the memory arrays 1010 and 1015, separately.

Although it has been assumed in the above description that applying no erase voltage means applying the erase voltage to neither the row select line group nor the source line, yet this is not necessarily indispensable. For example, the erase voltage may be applied to both the source line 1041 and the source line 1046 during the period from time t0 to time t3 shown in FIG. 17. In the case where no erase voltage is applied to the control gate, i.e., to the row select line group, the BTBT current is almost negligibly small, so that even when the erase voltage is applied to the source lines as described above, there is consumed only a current equivalent to that in the case where no erase voltage is applied to the source lines during the period from time t0 to time t1.

Likewise, for example, the erase voltage may be applied to both row select line groups 1021 and 1026 during the period from time t0 to time t3 shown in FIG. 17. In this case also, during the period from time t1 to time t2, there is consumed only a current equivalent to that in the case where no erase voltage is applied to the row select line group.

However, applying the erase voltage to a memory array that is not targeted for erase might cause some extent of changes in the threshold values of the memory cells. In the above example, this problem does not matter since the erase voltage is applied to only the memory cells that are erased finally. Otherwise, there is a need for checking changes in threshold value or reliability for their being well within a permissible range.

In addition, the erase method of this embodiment is not limited to the case where two blocks are targeted for erase, of course. The erase method is applicable also to cases where three or more blocks are targeted for erase.

(Seventh Embodiment)

Next, an erase method for a nonvolatile semiconductor storage device as a seventh embodiment of the invention is described with reference to FIGS. 18 and 19.

As described also in the foregoing sixth embodiment, it is not necessarily required to apply the erase voltage to both the row select line group and the source line with respect to the row select line groups and the source lines of a block to which the erase voltage is not applied.

This seventh embodiment is explained on a method in which the erase voltage is applied to neither the row select line group nor the source line with respect to a block to which the erase voltage is not applied.

Figure 18:
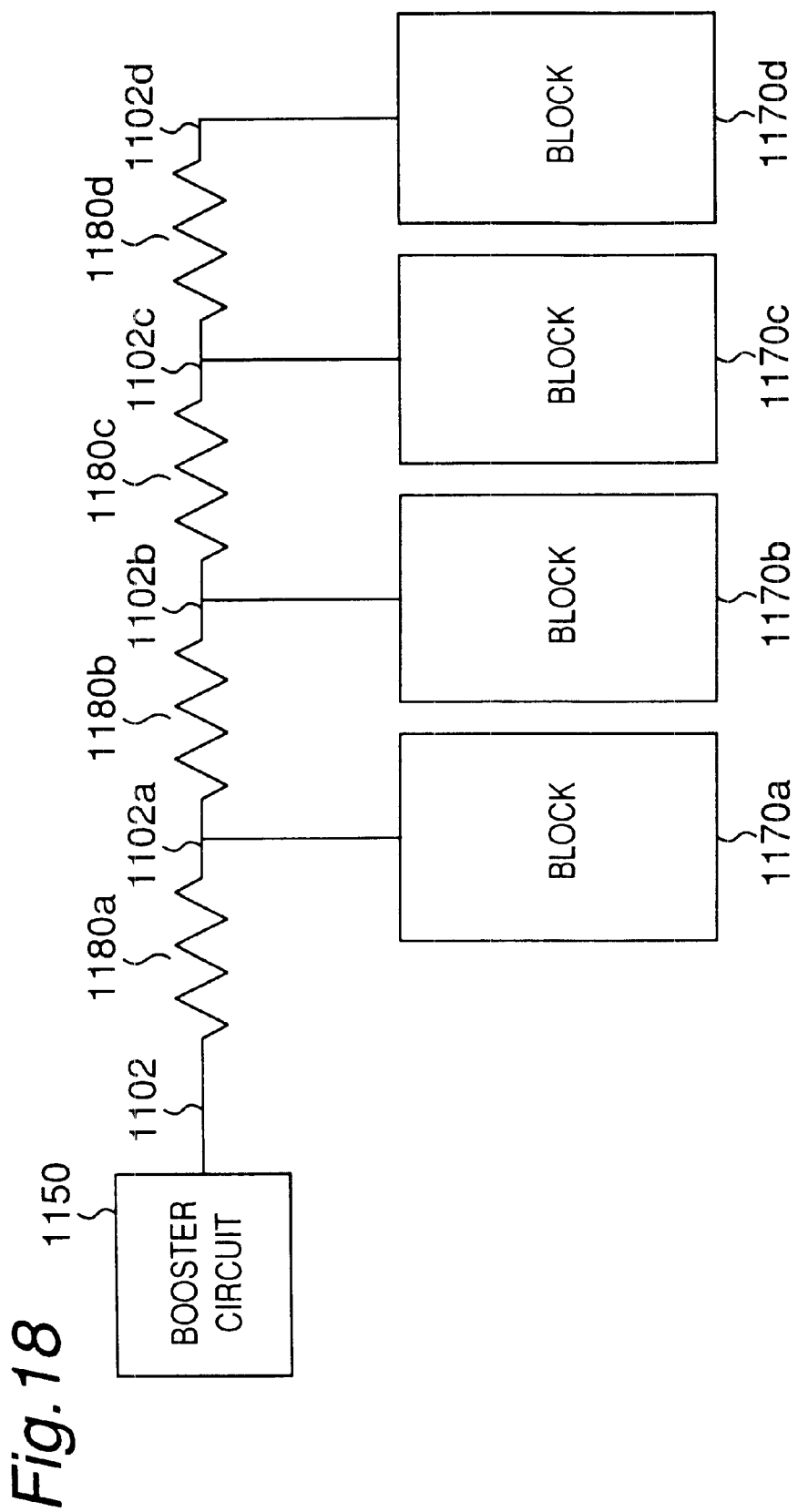
FIG. 18 is a block diagram for explaining an erase method as a seventh embodiment of the invention.

As an example of erase operation, for the explanation of this embodiment, the same settings as in the description of the prior art with FIG. 18 are assumed, that is, resistors 1180a–1180d all have 10 Ω, blocks 1170a–1170d each consume a maximum 10 mA of current from the source at an erase, the source voltage at this erase is permitted to lower to 0.4 V from the voltage generated by a booster circuit 1150, and the booster circuit 1150 has sufficient current supply capability.

Figure 19:
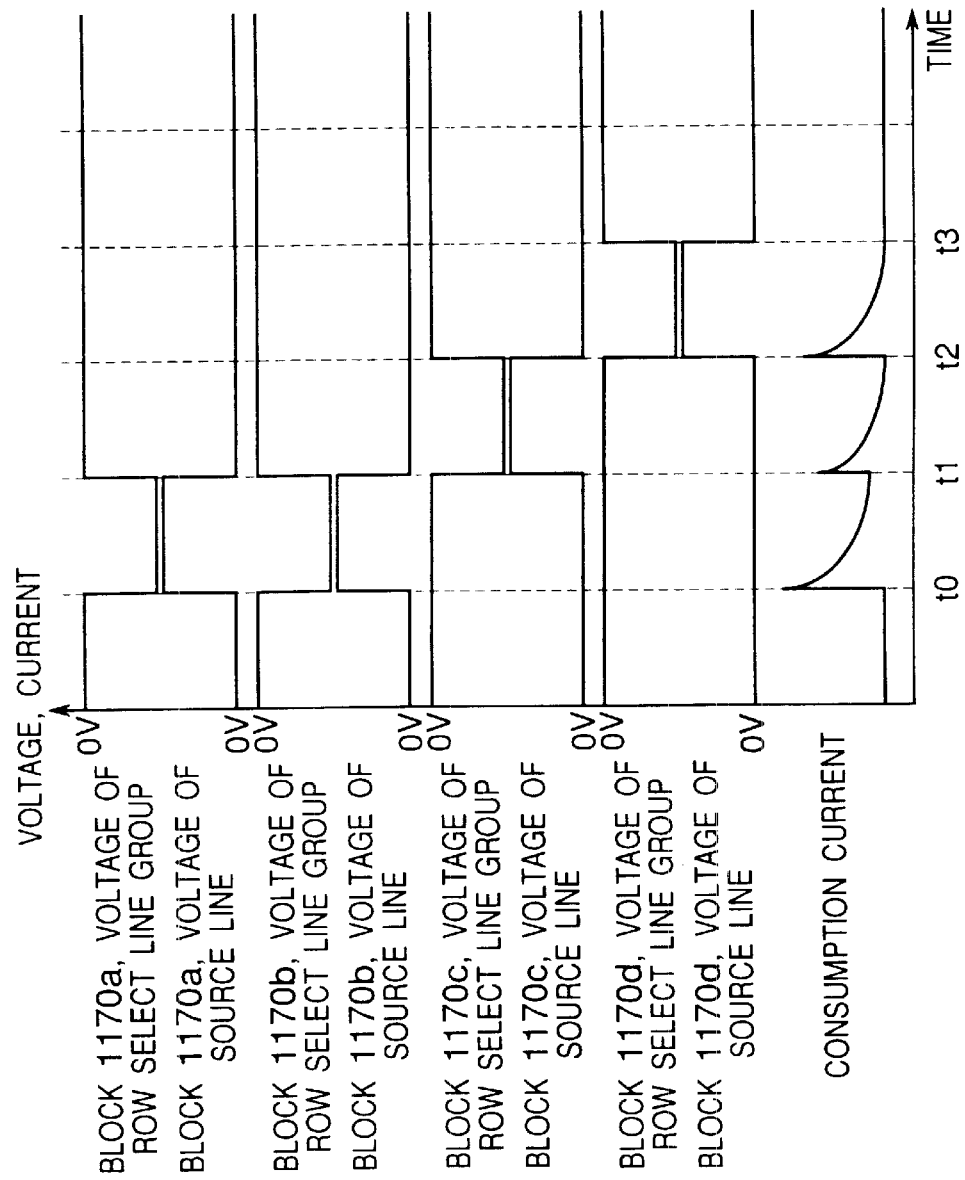
FIG. 19 is a voltage and current waveform diagram representing an erase operation in the seventh embodiment of the invention.

FIG. 19 shows an example of the erase voltage application method in this embodiment. In this one example, during the period from time t0 to time t1, the erase voltage is applied to the blocks 1170a and 1170b. That is, the row select line groups of the blocks 1170a and 1170b are set to a specified negative voltage, and the source line voltage is set to a specified positive voltage.

Next, during the period from time t1 to time t2, the erase voltage is applied to the block 1170c. That is, the row select line group of the block 1170c is set to a specified negative voltage, and the source line voltage is set to a specified positive voltage.

Next, during the period from time t2 to time t3, the erase voltage is applied to the block 1170d. That is, the row select line group of the block 1170d is set to a specified negative voltage, and the source line voltage is set to a specified positive voltage.

As shown above, in this embodiment, for the blocks 1170a and 1170b that are relatively small in source line resistance, the erase voltage is applied to both blocks at a time. For the blocks 1170c and 1170d that are relatively large in source line resistance, the erase voltage is applied sequentially block by block. As a result of this, a reduction in erase time can be achieved while drops of the source voltage in the erase operation is suppressed.

In details, source voltage drops in the erase operation of the blocks 1170a, 1170b, 1170c and 1170d were 0.2 V, 0.3 V, 0.3 V and 0.4 V, respectively, on the basis of the high voltage 1102 in FIG. 18, having fallen within the permissible range.

In addition, the values of source line resistance in the individual blocks may be previously measured, or otherwise, design values may also be adopted.

Although this embodiment has been explained on a case where the number of blocks is four, this erase method may be applied to cases where the number of blocks is three or more and the source line resistance differs among the blocks. That is, for a plurality of blocks that are relatively small in source line resistance, the erase voltage is applied to the blocks at a time. For blocks that are relatively large in source line resistance, the erase voltage is applied block by block. As a result, a reduction in erase time can be achieved while drops of the source voltage in the erase operation is suppressed.

Furthermore, combining this method of the seventh embodiment and the method of the foregoing sixth embodiment makes it possible to execute the erase operation even more efficiently.

(Eighth Embodiment)

Next, an erase method for a nonvolatile semiconductor storage device as an eighth embodiment of the invention is described.

This eighth embodiment is an embodiment in which the sixth embodiment and seventh embodiment described above are combined together.

The sixth embodiment described before is an example of the erase method in which the number of blocks to which the erase voltage is simultaneously applied is changed on the time base. Also, the seventh embodiment described above is an example of the erase method in which the number of blocks to which the erase voltage is simultaneously applied is increased or decreased depending on the level of the source line resistance by taking into consideration drops of the source line voltage due to the source line resistance.

This eighth embodiment is explained with reference to FIGS. 18 and 20. As an example of erase operation, for the explanation of this embodiment, the same settings as in the description of the prior art with FIG. 18 are assumed, that is, resistors 1180a–1180d all have 10 Ω, blocks 1170a–1170d each consume a maximum 10 mA of current from the source at an erase, the source voltage at this erase is permitted to lower to 0.4 V from the voltage generated by a booster circuit 1150, and the booster circuit 1150 has sufficient current supply capability.

In this eighth embodiment, as shown in FIG. 20, during the period from time t0 to time t1, the erase voltage is applied to the blocks 1170a and 1170c. That is, a negative voltage and a positive voltage are applied to the row select line groups and the source lines of the blocks 1170a and 1170c, respectively.

Next, during the period from time t1 to time t2, the erase voltage is applied to the block 1170d. Next, during the period from time t2 to time t3, the erase voltage is applied to the blocks 1170a, 1170b and 1170c. Next, during the period from time t3 to time t4, the erase voltage is applied to the blocks 1170b and 1170d.

In this eighth embodiment, as in the cases of the sixth and seventh embodiments, it is not necessarily required that with respect to the row select lines and the source lines of blocks to which the erase voltage is not applied, the erase voltage is applied neither to the row select lines nor to the source lines. In FIG. 20, for a simplified explanation, blocks to which the erase voltage is not applied are indicated by waveforms in the case where the erase voltage is applied neither to the row select lines nor to the source lines.

As shown in FIG. 20, during the period from time t0 to time t1, the period from time t1 to time t2, and the period from time t2 to time t3, the erase voltage is applied, so that the erase at the individual blocks is forwarded to thereby secure the time that allows the BTBT current to become a half or less. Normally, by experiments, the BTBT current behaves generally exponentially with respect to the erase voltage application time. Therefore, an elapse of one half the time required for erase given an expectation that the BTBT current becomes a half or less. In this case, for simplification of explanation, the time required for the BTBT current to become a half or less is assumed to be a half the time required for erase of one block.

This eighth embodiment adopts a method in which the number of blocks to which the erase voltage is simultaneously applied is changed on the time base, as described in the foregoing sixth embodiment. That is, during the period from time t0 to time t1, the erase voltage is applied to the two blocks 1170a and 1170c. During the period from time t1 to time t2, the erase voltage is applied to one block 1170d. Further, during the period from time t3 to time t4, the erase voltage is applied to the two blocks 1170b and 1170d.

This eighth embodiment also adopts the method in which the number of blocks to which the erase voltage is simultaneously applied is changed depending on the source line resistance, as described in the foregoing seventh embodiment. That is, for the block 1170d that is relatively large in source line resistance, the erase voltage is applied only to this one block 1170d at the time of the first erase voltage application (t1/t2). For the blocks 1170a and 1170c, on the other hand, the erase voltage is applied simultaneously to these two blocks 1170a and 1170c at the time of the first erase time (t0–t1).

During this period from time t0 to time t1, the erase for the blocks 1170a and 1170c is executed. In this operation, currents of 20 mA, 10 mA and 10 mA at maximums flow through source line resistors 1180a, 1180b and 1180c, respectively. Therefore, voltage drops due to resistance are 0.2 V, 0.1 V and 0.1 V at the source line resistors 1180a, 1180b and 1180c, respectively. Thus, in this case, the block 1170c is the lowest in source line voltage among the blocks to be erased, and the source line voltage drops by maximum 0.4 V from the high voltage 1102 at this block 1170c. This voltage drop is within a permissible range of source line voltage for erase.

Next, during the period from time t1 to time t2, the erase of the block 1170d is executed. In this case, the maximum values of currents flowing through the source line resistors 1180a, 1180b, 1180c and 1180d are 10 mA, 10 mA, 10 mA and 10 mA, respectively. Therefore, the voltage drops due to the source line resistance are 0.1 V, 0.1 V, 0.1 V and 0.1 V at the source line resistors 1180a, 1180b, 1180c and 1180d, respectively. Thus, the source line voltage of the block 1170d to be erased in this case drops by maximum 0.4 V from the high voltage 1102. This dropped source line voltage is within the permissible range of source line voltage at an erase.

During this period from time t2 to time t3, erase of the block 1170a, the block 1170b and the block 1170c is executed. Since these blocks 1170a and 1170c have progressed in erase during the period from time t0 to time t1, the maximum values of consumption currents of the source lines each become not more than 5 mA, which is one half, during the period from time t2 to time t3. In this case, the maximum values of currents flowing through the source line resistors 1180a, 1180b and 1180c are 20 mA, 15 mA and 5 mA, respectively. Therefore, in this case, the block 1170c is the lowest in source line voltage among the blocks 1170a–1170c to be erased, and the source line voltage of this block 1170c becomes a voltage dropped by maximum 0.4 V from the high voltage 1102. This voltage is within the permissible range of source line voltage at an erase.

Next, during the period from time t3 to time t4, erase of the blocks 1170b and 1170d is executed. The block 1170b has undergone the first erase during the preceding period from time t2 to time t3, and the block 1170d has undergone the first erase during the previous period from time t1 to time t2. Therefore, the maximum values of consumption currents of the source lines each become not more than 5 mA, which is one half. In this case, maximum currents of 10 mA, 10 mA, 5 mA and 5 mA flow through the source line resistors 1180a, 1180b, 1180c and 1180d, respectively. Thus, voltage drops due to the source line resistors 1180a, 1180b, 1180c and 1180d are 0.1 V, 0.1 V, 0.05 V and 0.05 V, respectively. Consequently, in this case, the block 1170d is the lowest in source line voltage among the blocks to be erased, and its source line voltage is a voltage dropped by maximum 0.3 V from the high voltage 1102. This voltage is within the permissible range of source line voltage at an erase.

As shown above, in this eighth embodiment, voltage drops of source voltage fall under permissible voltage drops in every erase operation in the sequence of erase operations, and yet a great reduction of the time required for erase is achieved.

In addition, in this embodiment, the erase methods shown in the foregoing first, second and fifth embodiments may also be adopted for the erase within one block.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A nonvolatile semiconductor storage device having a memory array constructed of a plurality of memory cells, a row select line control circuit, a column select line control circuit and a source line control circuit for controlling row select lines, column select lines and source lines respectively connected to each of the memory cells and a voltage generation circuit for individually generating voltages to be applied to the row select line and the source line, the memory array being subjected to erase by applying specified voltages to the row select line and the source line, wherein the row select line control circuit comprises a line group independent control means capable of independently controlling a plurality of row select line groups each of which is constructed of at least one row select line, and the voltage generation circuit comprises a consumption current limiting means for limiting a consumption current of the voltage generation circuit.

2. A nonvolatile semiconductor storage device as claimed in claim 1, wherein the consumption current limiting means is constructed of: an output current limiting means.

3. A nonvolatile semiconductor storage device as claimed in claim 1, wherein the consumption current limiting means is constructed of: an input current limiting circuit.

4. A nonvolatile semiconductor storage device as claimed in claim 1, wherein the consumption current limiting means activates only partially the voltage generation circuit.

5. A storage contents erase method for erasing storage contents of the memory array of the nonvolatile semiconductor storage device claimed in claim 1, comprising the step of:

changing a number of row select line groups to which a specified voltage necessary for erase is simultaneously applied by the line group independent control means according to a specified condition before the erase of all the memory cells in the memory array is completed among the plurality of row select line groups capable of being independently controlled.

6. A storage contents erase method of the nonvolatile semiconductor storage device claimed in claim 5, wherein the number of the row select line groups or the source lines to which the specified voltage necessary for the erase is simultaneously applied is changed every time the consumption current in the voltage generation circuit for generating the specified voltage becomes not higher than a specified value.

7. A storage contents erase method of the nonvolatile semiconductor storage device claimed in claim 5, wherein the number of the row select line groups or the source lines to which the specified voltage necessary for the erase is simultaneously applied is changed every predetermined time.

8. A storage contents erase method of the nonvolatile semiconductor storage device claimed in claim 6, wherein the number of the row select line groups or the source lines to which the specified voltage necessary for the erase is simultaneously applied is changed every time a threshold voltage of an objective memory cell to be erased becomes not higher than a specified value.

9. A storage contents erase method for erasing storage contents of the memory array of the nonvolatile semiconductor storage device claimed in claim 1, wherein overerase verify after an erase operation is executed after completing the erase operation of all objective memory cells to be erased.

10. A method for erasing storage contents of the nonvolatile semiconductor storage device claimed in claim 1, wherein erase is executed by switchover between an erase method for erasing in a batch a block of a memory cell area selected by the row select line group and the source line by controlling all the row select line groups in an identical operation and controlling all the source lines in an identical operation and a storage contents erase method claimed in claim 5.

11. A storage contents erase method of the nonvolatile semiconductor storage device claimed in claim 10, wherein the number of the row select line groups or the source lines to which the specified voltage necessary for the erase is simultaneously applied is changed every predetermined time.

12. A nonvolatile semiconductor storage device having a memory array constructed of a plurality of memory cells, a row select line control circuit, a column select line control circuit and a source line control circuit for controlling row select lines, column select lines and source lines respectively connected to each of the memory cells and a voltage generation circuit for individually generating voltages to be applied to the row select line and the source line, the memory array being subjected to erase by applying specified voltages to the row select line and the source line, wherein the source line control circuit comprises an independent control means capable of independently controlling a plurality of source lines, and the voltage generation circuit comprises a consumption current limiting means for limiting a consumption current of the voltage generation circuit.

13. A nonvolatile semiconductor storage device as claimed in claim 12, wherein the consumption current limiting means is constructed of: an output current limiting means.

14. A nonvolatile semiconductor storage device as claimed in claim 12, wherein the consumption current limiting means is constructed of: an input current limiting circuit.

15. A nonvolatile semiconductor storage device as claimed in claim 12, wherein the consumption current limiting means activates only partially the voltage generation circuit.

16. A storage contents erase method for erasing storage contents of the memory array of the nonvolatile semiconductor storage device claimed in claim 12, comprising the step of:

changing a number of source lines to which a specified voltage necessary for erase is simultaneously applied by the independent control means according to a specified condition before the erase of all the memory cells in the memory array is completed among the plurality of source lines capable of being independently controlled.

17. A storage contents erase method of the nonvolatile semiconductor storage device claimed in claim 16, wherein the number of the row select line groups or the source lines to which the specified voltage necessary for the erase is simultaneously applied is changed every time the consumption current in the voltage generation circuit for generating the specified voltage becomes not higher than a specified value.

18. A storage contents erase method for erasing storage contents of the memory array of the nonvolatile semiconductor storage device claimed in claim 12, wherein overerase verify after an erase operation is executed after completing the erase operation of all objective memory cells to be erased.

19. A storage contents erase method of the nonvolatile semiconductor storage device claimed in claim 16, wherein the number of the row select line groups or the source lines to which the specified voltage necessary for the erase is simultaneously applied is changed every time a threshold voltage of an objective memory cell to be erased becomes not higher than a specified value.

20. A method for erasing storage contents of the nonvolatile semiconductor storage device claimed in claim 2, wherein erase is executed by switchover between an erase method for erasing in a batch a block of a memory cell area selected by the row select line group and the source line by controlling all the row select line groups in an identical operation and controlling all the source lines in an identical operation and a storage contents erase method claimed in claim 16.

21. A nonvolatile semiconductor storage device as claimed in claim 1, comprising:

an erase method switchover means for executing the erase by switchover between an erase method for erasing in a batch a block of a memory cell area selected by the row select line group and the source line by controlling all the row select line groups in an identical operation and controlling all the source lines in an identical operation and a storage contents erase method claimed in claim 5.

22. A nonvolatile semiconductor storage device as claimed in claim 12, comprising:

an erase method switchover means for executing the erase by switchover between an erase method for erasing in a batch a block of a memory cell area selected by the row select line group and the source line by controlling all the row select line groups in an identical operation and controlling all the source lines in an identical operation and a storage contents erase method claimed in claim 16.

23. A nonvolatile semiconductor storage device storage contents erase method for executing erase of storage contents of a nonvolatile semiconductor storage device having a plurality of memory blocks including a memory array constructed of a plurality of memory cells, a row select line control circuit, a column select line control circuit and a source line control circuit for respectively controlling row select lines, column select lines and source lines respectively connected to each of the memory cells in each of the memory blocks and a voltage generation circuit for individually generating voltages to be applied to the row select line and the source line, by applying specified voltages to the row select line and the source line, comprising the steps of:

concurrently selecting the row select lines connected to the memory block by the row select line control circuit;

concurrently selecting the source lines connected to the memory block by the source line control circuit; and changing according to a specified condition a number of the memory blocks to the row select lines of which a specified voltage necessary for erase is simultaneously applied until the erase of all the memory cells included in the memory block in which the erase is executed is completed.

24. A nonvolatile semiconductor storage device storage contents erase method as claimed in claim 23, wherein the number of the memory blocks to the row select lines or the source lines of which the specified voltage necessary for the erase is simultaneously applied is changed every time a consumption current in the voltage generation circuit for generating the specified voltage becomes not higher than a specified value.

25. A nonvolatile semiconductor storage device storage contents erase method as claimed in claim 23, wherein the number of the memory blocks to both the row select line groups and the source lines of which an erase voltage is simultaneously applied is varied with a block in which the connected source line has a comparatively large wiring resistance and with a block in which the connected source line has a comparatively small wiring resistance.

26. A nonvolatile semiconductor storage device storage contents erase method as claimed in claim 25, wherein the blocks to which the erase voltage is simultaneously applied are selected so that a maximum value of a potential drop from an output of the voltage generation circuit for generating a voltage to be applied to the source line inputted to the block in which erase is executed falls within a predetermined permissible range.

27. A nonvolatile semiconductor storage device storage contents erase method as claimed in claim 23, wherein the erase of the memory array in the objective block to be erased is executed by the erase method claimed in claim 9.

28. A nonvolatile semiconductor storage device storage contents erase method as claimed in claim 23, wherein the erase of the memory array in the objective block to be erased is executed by the erase method claimed in claim 16.

* * * * *